US009030229B2

(12) United States Patent　(10) Patent No.: US 9,030,229 B2
Koo　(45) Date of Patent: May 12, 2015

(54) IMPEDANCE TUNING CIRCUIT AND INTEGRATED CIRCUIT INCLUDING THE SAME

(71) Applicant: Samsung Electronics Co., Ltd., Suwon-si (KR)

(72) Inventor: Kyung Hoi Koo, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 79 days.

(21) Appl. No.: 13/660,117

(22) Filed: Oct. 25, 2012

(65) Prior Publication Data

US 2013/0214812 A1　Aug. 22, 2013

(30) Foreign Application Priority Data

Feb. 17, 2012　(KR) .......................... 10-2012-0016166

(51) Int. Cl.
  *H03K 19/003*　(2006.01)
  *H03K 19/00*　(2006.01)
  *H03K 19/0185*　(2006.01)

(52) U.S. Cl.
  CPC .... *H03K 19/018571* (2013.01); *H03K 19/0005* (2013.01)

(58) Field of Classification Search
  USPC ....................... 326/21, 26, 30, 81–83, 86–87; 327/108–109
  See application file for complete search history.

(56) References Cited

U.S. PATENT DOCUMENTS

| 7,633,310 B2 * | 12/2009 | Fukushi .......................... 326/30 |
| 2008/0079458 A1 | 4/2008 | Shin et al. |
| 2008/0122452 A1 * | 5/2008 | Clements et al. ............. 324/601 |
| 2009/0002018 A1 * | 1/2009 | Jeong et al. ..................... 326/30 |
| 2010/0177588 A1 | 7/2010 | Kaiwa et al. |
| 2010/0225349 A1 * | 9/2010 | Santurkar et al. ............... 326/30 |
| 2011/0025373 A1 * | 2/2011 | Kim et al. ....................... 326/30 |
| 2011/0062984 A1 * | 3/2011 | Kuwahara et al. ............. 326/30 |
| 2011/0074462 A1 | 3/2011 | Chung |
| 2011/0163778 A1 * | 7/2011 | Moon ............................ 326/30 |

(Continued)

FOREIGN PATENT DOCUMENTS

| JP | 2010-166299 | 7/2010 |
| KR | 10-0875675 | 12/2008 |
| KR | 10-1027689 | 3/2011 |

OTHER PUBLICATIONS

English Abstract for Publication No. 10-2008-0030944 (for 10-0875675).

(Continued)

*Primary Examiner* — Alexander H Taningco
*Assistant Examiner* — Christopher Lo
(74) *Attorney, Agent, or Firm* — F. Chau & Associates, LLC

(57) ABSTRACT

An impedance tuning circuit includes a calibration unit and a post-processing unit. The calibration unit generates an initial pull-up code and an initial pull-down code by performing a calibration operation using an external resistor during an initial impedance tuning operation. The post-processing unit outputs the initial pull-up code and the initial pull-down code as a final pull-up code and a final pull-down code during the initial impedance tuning operation, and generates the final pull-up code and the final pull-down code by using the initial pull-up code and the initial pull-down code during a subsequent impedance tuning operation.

11 Claims, 13 Drawing Sheets

(56) References Cited

U.S. PATENT DOCUMENTS

2012/0025800 A1* 2/2012 Dettloff et al. ............... 323/299
2012/0056641 A1* 3/2012 Kuroki et al. ................ 326/30

OTHER PUBLICATIONS

English Abstract for Publication No. 2010-166299.
English Abstract for Publication No. 10-1027689.

* cited by examiner

FIG. 5

| | CR3 | CR4 | CR5 | CR6 | CR7 | FPUC | FPDC |
|---|---|---|---|---|---|---|---|
| 410 | 0 | 0 | 0 | 0 | 0 | IPUC+2 | IPDC+2 |
| 420 | 1 | 0 | 0 | 0 | 0 | IPUC+1 | IPDC+1 |
| 430 | 1 | 1 | 0 | 0 | 0 | IPUC | IPDC |
| 440 | 1 | 1 | 1 | 0 | 0 | IPUC | IPDC |
| 450 | 1 | 1 | 1 | 1 | 0 | IPUC-1 | IPDC-1 |
| 460 | 1 | 1 | 1 | 1 | 1 | IPUC-2 | IPDC-2 |

# IMPEDANCE TUNING CIRCUIT AND INTEGRATED CIRCUIT INCLUDING THE SAME

CROSS-REFERENCE TO RELATED APPLICATION

This U.S. non-provisional application claims under 35 U.S.C. §119 priority to and the benefit of Korean Patent Application No. 2012-0016166 filed on Feb. 17, 2012 in the Korean Intellectual Property Office (KIPO), the entire content of which is incorporated by reference herein.

BACKGROUND

1. Technical Field

The present disclosure relates to semiconductor devices, and, more particularly, to impedance tuning circuits and integrated circuits including the impedance tuning circuits.

2. Discussion of the Related Art

As the operating speed of a system having integrated circuits increases, swing widths of signals interfaced between the integrated circuits decrease. A reason for the decrease of the swing widths is to minimize the time taken to transmit the signals. However, as the swing widths decrease, the signals transferred between the integrated circuits can be more easily distorted by an impedance mismatch caused by process, voltage and temperature (PVT) variations. If the signals transferred between the integrated circuits are distorted, setup/hold failure, for example, may be caused by the distorted signals. An impedance tuning circuit for adjusting an output impedance and/or a termination impedance can be employed at transmitting and/or receiving stages of the integrated circuits. However, since conventional impedance tuning circuits require hundreds of cycles to adjust the output impedance and/or the termination impedance by comparing the output impedance and/or the termination impedance with an impedance of an external resistor, the performance of the system can deteriorate while the impedance tuning circuit performs the impedance tuning operation.

SUMMARY

According to an exemplary embodiment of the present disclosure an impedance tuning circuit capable of reducing an impedance tuning time is provided.

According to an exemplary embodiment an integrated circuit including an impedance tuning circuit capable of reducing an impedance tuning time is provided.

In an exemplary embodiment an impedance tuning circuit includes a calibration unit configured to generate an initial pull-up code and an initial pull-down code by performing a calibration operation using an external resistor during an initial impedance tuning operation, and a post-processing unit configured to output the initial pull-up code and the initial pull-down code as a final pull-up code and a final pull-down code during the initial impedance tuning operation, and configured to generate the final pull-up code and the final pull-down code by using the initial pull-up code and the initial pull-down code during a subsequent impedance tuning operation.

During the subsequent impedance tuning operation, the calibration unit may be configured to not perform the calibration operation, and to output instead the initial pull-up code and the initial pull-down code generated during the initial impedance tuning operation as the final pull-up code and the final pull-down code, respectively.

The calibration unit may include: a first pull-up array coupled to the external resistor, a first comparator configured to compare a voltage at a first node between the first pull-up array and the external resistor with a reference voltage, a pull-up finite state machine configured to generate the initial pull-up code based upon an output signal of the first comparator; a second pull-up array configured to have a pull-up impedance corresponding to the initial pull-up code in response to the initial pull-up code generated by the pull-up finite state machine, a pull-down array coupled to the second pull-up array, a second comparator configured to compare a voltage at a second node between the second pull-up array and the pull-down array with the reference voltage, and a pull-down finite state machine configured to generate the initial pull-down code based upon an output signal of the second comparator.

The post-processing unit may include: a plurality of pull-up arrays configured to receive a plurality of pull-up codes having the initial pull-up code as a center value, and configured to have a plurality of pull-up impedances respectively corresponding to the plurality of pull-up codes, a plurality of pull-down arrays respectively coupled to the plurality of pull-up arrays, the plurality of pull-down arrays configured to receive a plurality of pull-down codes having the initial pull-down code as a center value, and configured to have a plurality of pull-down impedances respectively corresponding to the plurality of pull-down codes, a plurality of comparators configured to generate a plurality of output signals by comparing voltages at a plurality of nodes between the plurality of pull-up arrays and the plurality of pull-down arrays with a reference voltage; and a decision circuit configured to determine the final pull-up code and the final pull-down code based upon the plurality of output signals of the plurality of comparators.

The post-processing unit may be configured to complete the subsequent impedance tuning operation within two clock cycles.

During the subsequent impedance tuning operation, the post-processing unit may compare the voltages at the plurality of nodes with the reference voltage at a first clock cycle, and may determine the final pull-up code and the final pull-down code based upon a result of the comparison at a second clock cycle.

At least one of the plurality of pull-up arrays and at least one of the plurality of pull-down arrays may be shared by the calibration unit and the processing unit.

The post-processing unit may include: a plurality of first pull-up arrays respectively coupled to a plurality of resistors, the plurality of first pull-up arrays configured to receive a plurality of pull-up codes having the initial pull-up code as a center value, and configured to have a plurality of pull-up impedances respectively corresponding to the plurality of pull-up codes, a plurality of first comparators configured to generate a plurality of first output signals by comparing voltages at a plurality of first nodes between the plurality of first pull-up arrays and the plurality of resistors with a reference voltage, a plurality of second pull-up arrays configured to receive the final pull-up code determined based upon the plurality of first output signals of the plurality of first comparators, and configured to have a pull-up impedance corresponding to the final pull-up code, a plurality of pull-down arrays respectively coupled to the plurality of second pull-up arrays, the plurality of pull-down arrays configured to receive a plurality of pull-down codes having the initial pull-down code as a center value, and configured to have a plurality of pull-down impedances respectively corresponding to the plurality of pull-down codes, a plurality of second comparators configured to generate a plurality of second output signals by comparing voltages at a plurality of second nodes between the plurality of second pull-up arrays and the plurality of pull-down arrays with the reference voltage, and a decision circuit configured to determine the final pull-up code based upon the plurality of first output signals of the plurality of first comparators, and configured to determine the final pull-down code based upon the plurality of second output signals of the plurality of second comparators.

During the subsequent impedance tuning operation, the post-processing unit may determine the final pull-up code at two first clock cycles, and determines the final pull-down code at two second clock cycles.

One of the plurality of resistors may be the external resistor.

The post-processing unit may include: a pull-up array configured to sequentially receive a plurality of pull-up codes having the initial pull-up code as a center value, and configured to sequentially have a plurality of pull-up impedances respectively corresponding to the plurality of pull-up codes, a pull-down array coupled to the pull-up array, the pull-down array configured to sequentially receive a plurality of pull-down codes having the initial pull-down code as a center value, and configured to sequentially have a plurality of pull-down impedances respectively corresponding to the plurality of pull-down codes, a comparator configured to sequentially generate a plurality of output signals by comparing a voltage at a node between the pull-up array and the pull-down array with a reference voltage, and a decision circuit configured to determine the final pull-up code and the final pull-down code based upon the plurality of output signals sequentially output from the comparator.

The post-processing unit may include: a first pull-up array coupled to the external resistor, the first pull-up array configured to sequentially receive a plurality of pull-up codes having the initial pull-up code as a center value, and configured to sequentially have a plurality of pull-up impedances respectively corresponding to the plurality of pull-up codes; a first comparator configured to sequentially generate a plurality of first output signals by comparing a voltage at first node between the first pull-up array and the external resistor with a reference voltage; a second pull-up array configured to receive the final pull-up code determined based upon the plurality of first output signals sequentially output from the first comparator, and configured to have a pull-up impedance corresponding to the final pull-up code, a pull-down array coupled to the second pull-up array, the pull-down array configured to sequentially receive a plurality of pull-down codes having the initial pull-down code as a center value, and configured to sequentially have a plurality of pull-down impedances respectively corresponding to the plurality of pull-down codes, a second comparator configured to sequentially generate a plurality of second output signals by comparing a voltage at a second node between the second pull-up array and the pull-down array with the reference voltage, and a decision circuit configured to determine the final pull-up code based upon the plurality of first output signals sequentially output from the first comparator, and to determine the final pull-down code based upon the plurality of second output signals sequentially output from the second comparator.

According to an exemplary embodiment, an integrated circuit includes: at least one pad, at least one output driver configured to transmit a signal through the at least one pad, and an impedance tuning circuit configured to apply a final pull-up code and a final pull-down code to the at least one output driver to adjust an impedance of the at least one output driver, the impedance tuning circuit having a calibration unit configured to generates an initial pull-up code and an initial pull-down code by performing a calibration operation using an external resistor during an initial impedance tuning operation, and a post-processing unit configured to output the initial pull-up code and the initial pull-down code as the final pull-up code and the final pull-down code during the initial impedance tuning operation, and configured to generate the final pull-up code and the final pull-down code by using the initial pull-up code and the initial pull-down code during a subsequent impedance tuning operation.

The integrated circuit may include at least one of a system-on-chip, a mobile system-on-chip, a processor, a memory controller and a memory device.

The external resistor may be located outside the integrated circuit.

According to an exemplary embodiment, an integrated circuit includes: a calibration unit, a post-processing unit responsive to an initial pull-up code and an initial pull-down code from the calibration unit and configured to output final pull-up codes and final pull-down codes, and an output driver having: a pull-up array that, in response to a final pull-up code, has a pull-up impedance corresponding to the final pull-up code, and a pull-down array that, in response to a final pull-down code, has a pull-down impedance corresponding to the final pull-down code.

During an initial impedance tuning operation, the calibration unit may be configured to generate the initial pull-up code by adjusting a pull-up impedance of an internal pull-up array based upon external resistor, and to generate the initial pull-down code by adjusting a pull-down impedance of an internal pull-down array using the adjusted pull-up impedance. During the initial impedance tuning operation, the post-processing unit may be configured to output the initial pull-up code and the initial pull-down code as a final pull-up code and a final pull-down code.

During a subsequent impedance tuning operation after the initial impedance tuning operation, the calibration unit may be configured to output without calibration the initial pull-up code and the initial pull-down code that are generated during the initial impedance tuning operation. During the subsequent impedance tuning operation, the post-processing unit may be configured to select as the final pull-up code, one pull-up code from a plurality of pull-up codes having the initial pull-up code as a center value, and may be configured to select as the final pull-down code, one pull-down code from a plurality of pull-down codes having the initial pull-down code as the center value.

BRIEF DESCRIPTION OF THE DRAWINGS

Illustrative, non-limiting exemplary embodiments will be more clearly understood from the following detailed description taken in conjunction with the accompanying drawings.

FIG. 5 is a diagram for describing an example of an operation of a decision circuit included in an impedance tuning circuit of FIG. 2.

DETAILED DESCRIPTION OF THE EMBODIMENTS

Figure 1:
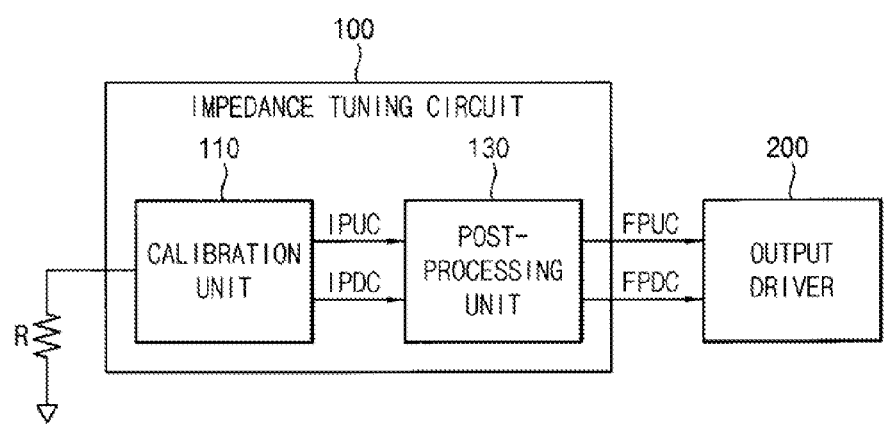
FIG. 1 is a block diagram illustrating an impedance tuning circuit according to an exemplary embodiment.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, and/or sections, these elements, components, regions, and/or sections should not be limited by these terms. These terms are only used to distinguish one element, component, region, or section from another region, layer or section. Thus, a first element, component, region, or section discussed below could be termed a second element, component, region, layer or section without departing from the teachings of the present inventive concept.

FIG. 1 is a block diagram illustrating an impedance tuning circuit according to exemplary embodiments.

Referring to FIG. 1, an impedance tuning circuit 100 includes a calibration unit 110 and a post-processing unit 130. The calibration unit 110 may be coupled to an external resistor R. In an exemplary embodiment, the post-processing unit 130 may be coupled to an output driver 200, a termination circuit or a merged driver where the output driver 200 and the termination circuit are merged into an integrated unit.

During an initial impedance tuning operation, the calibration unit 110 may generate an initial pull-up code IPUC and an initial pull-down code IPDC by performing a calibration operation using the external resistor R. For example, the calibration unit 110 may generate the initial pull-up code IPUC by adjusting a pull-up impedance of an internal pull-up array using the external resistor R, and may generate the initial pull-down code IPDC by adjusting a pull-down impedance of an internal pull-down array using the adjusted pull-up impedance. Here, the initial impedance tuning operation may be an impedance tuning operation that is initially performed when an integrated circuit is powered on.

During the initial impedance tuning operation, the post-processing unit 130 may output the initial pull-up code IPUC and the initial pull-down code IPDC as a final pull-up code FPUC and a final pull-down code FPDC. The final pull-up code FPUC and the final pull-down code FPDC output from the post-processing unit 130 may be provided to the output driver 200, the termination circuit or the merged driver. For example, a pull-up array included in the output driver 200 may have a pull-up impedance corresponding to the final pull-up code FPUC in response to the final pull-up code FPUC output from the post-processing unit 130, and a pull-down array included in the output driver 200 may have a pull-down impedance corresponding to the final pull-down code FPDC in response to the final pull-down code FPDC output from the post-processing unit 130. Accordingly, the output driver 200 may have predetermined pull-up and/or pull-down impedances regardless of process, voltage and temperature (PVT) variations that can affect the impedances of circuit components, particularly semiconductors whose materials can be sensitive to such variations.

Since impedances of the output driver 200 and/or the termination circuit are adjusted by the initial impedance tuning operation, exact signals may be transferred without signal distortion between integrated circuits having the impedance tuning circuit 100. However, while the integrated circuit operates, the impedance of the output driver 200 and/or the termination circuit may change due to the PVT variations with the lapse of time after the initial impedance tuning operation. Thus, the impedance tuning circuit 100 may periodically perform a subsequent impedance tuning operation while the integrated circuit operates.

During the subsequent impedance tuning operation, the calibration unit 110 may not perform the calibration operation, and may output the initial pull-up code IPUC and the initial pull-down code IPDC that are generated during the initial impedance tuning operation. During the subsequent impedance tuning operation, the post-processing unit 130 may generate the final pull-up code FPUC and the final pull-down code FPDC by using the initial pull-up code IPUC and the initial pull-down code IPDC. For example, the post-processing unit 130 may select, as the final pull-up code FPUC, one pull-up code from a plurality of pull-up codes having the initial pull-up code IPUC as the center value, and may select, as the final pull-down code FPDC, one pull-down code from a plurality of pull-down codes having the initial pull-down code IPDC as the center value. That is, the post-processing unit 130 may search the final pull-up code FPUC and the final pull-down code FPDC based upon the initial pull-up code IPUC and the initial pull-down code IPDC, thereby reducing an impedance tuning time of the subsequent impedance tuning operation.

As described above, during the subsequent impedance tuning operation, the impedance tuning circuit 100 according to exemplary embodiments may generate the final pull-up code FPUC and the final pull-down code FPDC by using the initial pull-up code IPUC and the initial pull-down code IPDC that are generated by an impedance tuning operation (e.g., the initial impedance tuning operation) previously performed before the subsequent impedance tuning operation. Accordingly, the impedance tuning circuit 100 according to exemplary embodiments may reduce the impedance tuning time of the subsequent impedance tuning operation.

Figure 2:
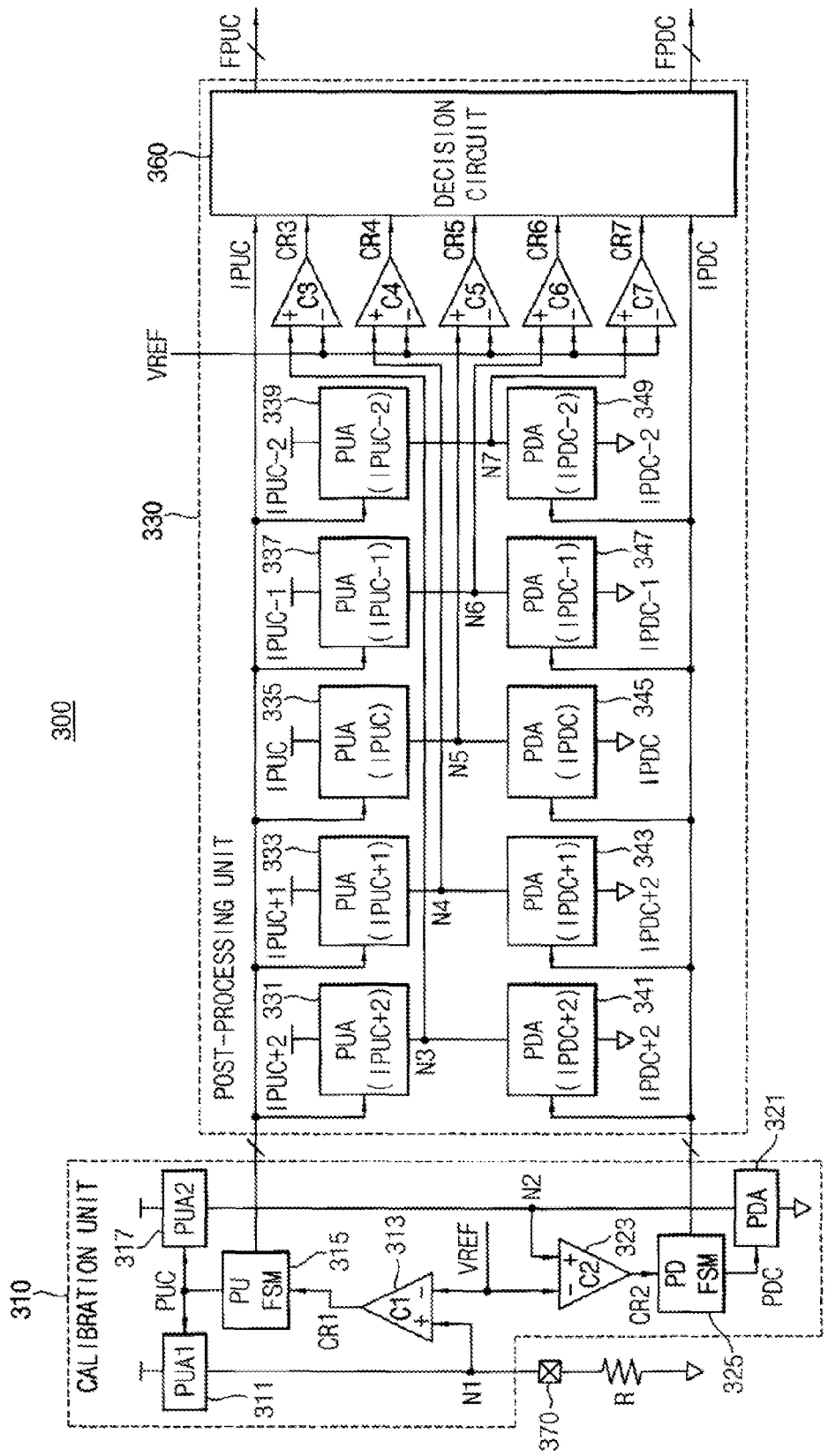
FIG. 2 is a circuit diagram illustrating an impedance tuning circuit according to an exemplary embodiment.
Figure 3:
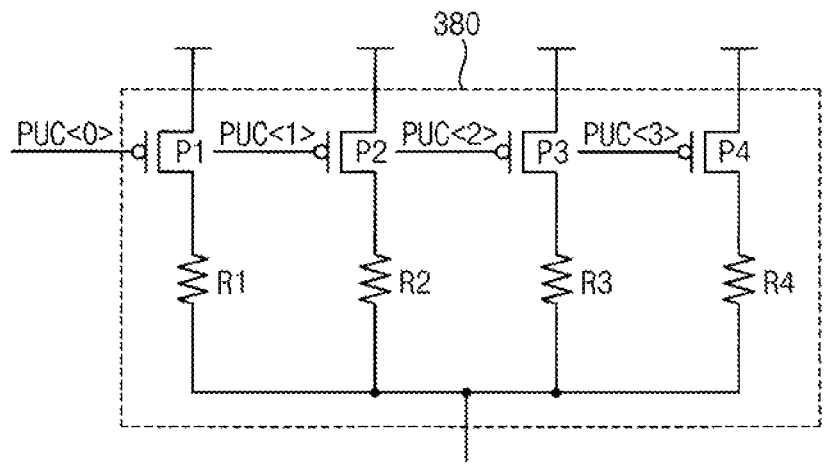
FIG. 3 is a circuit diagram illustrating an example of a pull-up array included in an impedance tuning circuit of FIG. 2.
Figure 4:
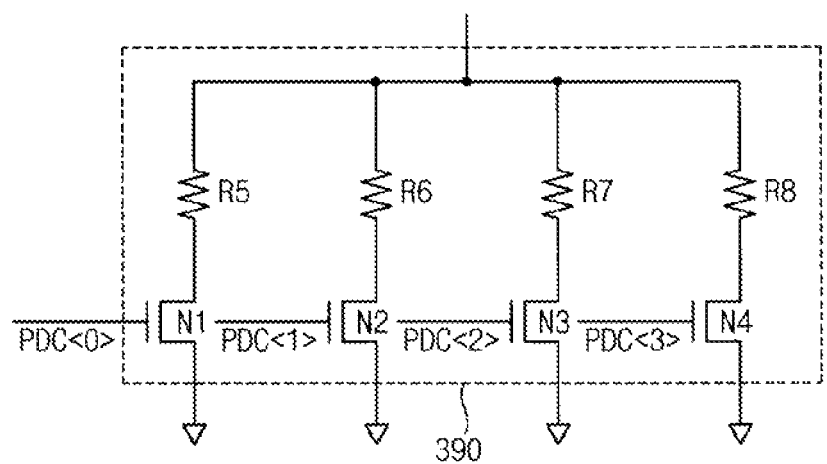
FIG. 4 is a circuit diagram illustrating an example of a pull-down array included in an impedance tuning circuit of FIG. 2.

FIG. 2 is a circuit diagram illustrating an impedance tuning circuit according to exemplary embodiments. FIG. 3 is a circuit diagram illustrating an example of a pull-up array included in an impedance tuning circuit of FIG. 2. FIG. 4 is a circuit diagram illustrating an example of a pull-down array included in an impedance tuning circuit of FIG. 2. FIG. 5 is a diagram for describing an example of an operation of a decision circuit included in an impedance tuning circuit of FIG. 2.

Referring to FIG. 2, an impedance tuning circuit 300 includes a calibration unit 310 and a post-processing unit 330.

The calibration unit 310 may be coupled to an external resistor R through a pad 370. During an initial impedance timing operation, the calibration unit 310 may generate an initial pull-up code IPUC and an initial pull-down code IPDC by performing a calibration operation using the external resistor R. The calibration unit 310 may include a first pull-up array 311, a first comparator 313, a pull-up finite state machine 315, a second pull-up array 317, a first pull-down array 321, a second comparator 323 and a pull-down finite state machine 325.

The first pull-up array 311 may be coupled to the external resistor R through the pad 370. The first pull-up array 311 may receive a pull-up code PUC from the pull-up finite state machine 315, and may have a pull-up impedance corresponding to the pull-up code PUC in response to the pull-up code PUC. For example, as illustrated in FIG. 3, the first pull-up array 311 may have an array configuration 380 which may include a plurality of PMOS transistors P1, P2, P3 and P4 to which a plurality of bits PUC<0>, PUC<1>, PUC<2>, PUC<3> of the pull-up code PUC are respectively applied, and a plurality of resistors R1, R2, R3, R4 respectively coupled to the plurality of PMOS transistors P1, P2, P3, P4. The plurality of PMOS transistors P1, P2, P3, P4 may be selectively turned on or off according to the plurality of bits PUC<0>, PUC<1>, PUC<2>, PUC<0> of the pull-up code PUC, and thus the pull-up impedance of the first pull-up array 311 may be changed.

The first comparator 313 may compare a voltage at a first node N1 between the first pull-up array 311 and the external resistor R with a reference voltage VREF. According to exemplary embodiments, the reference voltage VREF may be provided from a reference voltage generator located inside or outside the impedance tuning circuit 300. For example, the reference voltage VREF may have a voltage level corresponding to about half a voltage level of a power supply voltage.

The pull-up finite state machine 315 may generate the initial pull-up code IPUC based upon a first output signal CR1 of the first comparator 313. For example, the pull-up finite state machine 315 may sequentially increase or decrease the pull-up code PUC applied to the first pull-up array 311. If the pull-up code PUC is sequentially increased or decreased, the pull-up impedance of the first pull-up array 311 may sequentially change, and thus the voltage at the first node N1 may sequentially change. The first comparator 313 may compare the sequentially changed voltage at the first node N1 with the reference voltage VREF. The pull-up finite state machine 315 may sequentially receive the first output signal CR1 according to the increase or decrease of the pull-up code PUC, and may select as the initial pull-up code IPUC a pull-up code PUC that causes the voltage at the first node N1 to be substantially equal to the reference voltage VREF based upon the sequentially received first output signal CR1.

The second pull-up array 317 may receive the initial pull-up code IPUC from the pull-up finite state machine 315, and may have a pull-up impedance corresponding to the initial pull-up code IPUC. The second pull-up array 317 may have a configuration substantially the same as a configuration of the first pull-up array 311, such as the array configuration 380 of FIG. 3.

The first pull-down array 321 may be coupled to the second pull-up array 317. The first pull-down array 321 may receive a pull-down code PDC from the pull-down finite state machine 325, and may have a pull-down impedance corresponding to the pull-down code PDC in response to the pull-down code PDC. For example, as illustrated in FIG. 4, the first pull-down array 321 may have an array configuration 390 which may include a plurality of NMOS transistors N1, N2, N3, N4 to which a plurality of bits PDC<0>, PDC<1>, PDC<2>, PDC<3> of the pull-down code PDC are respectively applied, and a plurality of resistors R5, R6, R7, R8 respectively coupled to the plurality of NMOS transistors N1, N2, N3, N4. The plurality of NMOS transistors N1, N2, N3, N4 are selectively turned on or off according to the plurality of bits PDC<0>, PDC<1>, PDC<2>, PDC<3> of the pull-down code PDC, and thus the pull-down impedance of the first pull-down array 321 may be changed.

The second comparator 323 may compare a voltage at a second node N2 between the second pull-up array 317 and the first pull-down array 321 with the reference voltage VREF.

The pull-down finite state machine 325 may generate the initial pull-down code IPDC based upon a second output signal CR2 of the second comparator 323. For example, the pull-down finite state machine 325 may sequentially increase or decrease the pull-down code PDC applied to the first pull-down array 321. If the pull-down code PDC is sequentially increased or decreased, the pull-down impedance of the first pull-down array 321 may sequentially change, and thus the voltage at the second node N2 may sequentially change. The second comparator 323 may compare the sequentially changed voltage at the second node N2 with the reference voltage VREF. The pull-down finite state machine 325 may sequentially receive the second output signal CR2 according to the increase or decrease of the pull-down code PDC, and may select as the initial pull-down code IPDC a pull-down code PUC that causes the voltage at the second node N2 to be substantially equal to the reference voltage VREF based upon the sequentially received second output signal CR2.

After the initial pull-up code IPUC and the initial pull-down code IPDC are generated, the post-processing unit 330 may output the initial pull-up code IPUC and the initial pull-down code IPDC as a final pull-up code FPUC and a final pull-down code FPDC. Accordingly, the initial impedance tuning operation may be completed.

The impedance tuning circuit 300 may further perform a subsequent impedance tuning operation while an integrated circuit including the impedance tuning circuit 300 operates. During the subsequent impedance tuning operation, the calibration unit 310 may not perform the calibration operation, and may output the initial pull-up code IPUC and the initial pull-down code IPDC that are generated during the initial impedance tuning operation. During the subsequent impedance tuning operation, the post-processing unit 330 may generate the final pull-up code FPUC and the final pull-down code FPDC by using the initial pull-up code IPUC and the initial pull-down code IPDC. The post-processing unit 330 may include a plurality of pull-up arrays 331, 333, 335, 337, 339, a plurality of pull-down arrays 341, 343, 345, 347, 349, a plurality of comparators C3, C4, C5, C6, C7 and a decision circuit 360.

The plurality of pull-up arrays 331, 333, 335, 337, 339 may receive a plurality of pull-up codes IPUC+2, IPUC+1, IPUC, IPUC−1, IPUC−2 having the initial pull-up code IPUC as a center value from the pull-up finite state machine 315, and may have a plurality of pull-up impedances corresponding to the plurality of pull-up codes IPUC+2, IPUC+1, IPUC, IPUC−1, IPUC−2. For example, the plurality of pull-up arrays 331, 333, 335, 337, 339 may include third through seventh pull-up arrays 331, 333, 335, 337, 339. The third through seventh pull-up arrays 331, 333, 335, 337, 339 may receive a pull-up code IPUC+2 greater than the initial pull-up code IPUC by 2, a pull-up code IPUC+1 greater than the initial pull-up code IPUC by 1, the initial pull-up code IPUC, a pull-up code IPUC−1 less than the initial pull-up code IPUC by 1, and a pull-up code IPUC−2 less than the initial pull-up code IPUC by 2, respectively. Accordingly, the third pull-up array 331 may have a pull-up impedance corresponding to the pull-up code IPUC+2 greater than the initial pull-up code IPUC by 2. The fourth pull-up array 333 may have a pull-up impedance corresponding to the pull-up code IPUC+1 greater than the initial pull-up code IPUC by 1. The fifth pull-up array 335 may have a pull-up impedance corresponding to the initial pull-up code IPUC. The sixth pull-up array 337 may have a pull-up impedance corresponding to the pull-up code IPUC−1 less than the initial pull-up code IPUC by 1. The seventh pull-up array 339 may have a pull-up impedance corresponding to the pull-up code IPUC−2 less than the initial pull-up code IPUC by 2. Each of the plurality of pull-up arrays 331, 333, 335, 337, 339 may have a configuration substantially the same as that of the pull-up array 380 of FIG. 3.

The plurality of pull-down arrays 341, 343, 345, 347, 349 may be coupled to the plurality of pull-up arrays 331, 333, 335, 337, 339, respectively. The plurality of pull-down arrays 341, 343, 345, 347, 349 may receive a plurality of pull-down codes IPDC+2, IPDC+1, IPDC, IPDC−1, IPDC−2 having the initial pull-down code IPDC as a center value from the pull-down finite state machine 325, and may have a plurality of pull-down impedances corresponding to the plurality of pull-down codes IPDC+2, IPDC+1, IPDC, IPDC−1, IPDC−2. For example, the plurality of pull-down arrays 341, 343, 345, 347, 349 may include second through sixth pull-down arrays 341, 343, 345, 347, 349. The second through sixth pull-down arrays 341, 343, 345, 347, 349 may receive a pull-down code IPDC+2 greater than the initial pull-down code IPDC by 2, a pull-down code IPDC+1 greater than the initial pull-down code IPDC by 1, the initial pull-down code IPDC, a pull-down code IPDC−1 less than the initial pull-down code IPDC by 1, and a pull-down code IPDC−2 less than the initial pull-down code IPDC by 2, respectively. Accordingly, the second pull-down array 341 may have a pull-down impedance corresponding to the pull-down code IPDC+2 greater than the initial pull-down code IPUD by 2. The third pull-down array 343 may have a pull-down impedance corresponding to the pull-down code IPDC+1 greater than the initial pull-down code IPDC by 1. The fourth pull-down array 345 may have a pull-down impedance corresponding to the initial pull-down code IPDC. The fifth pull-down array 347 may have a pull-down impedance corresponding to the pull-down code IPDC−1 less than the initial pull-down code IPDC by 1. The sixth pull-down array 349 may have a pull-down impedance corresponding to the pull-down code IPDC−2 less than the initial pull-down code IPDC by 2. Each of the plurality of pull-down arrays 341, 343, 345, 347, 349 may have a configuration substantially the same as that of the pull-down array 390 of FIG. 4.

The plurality of comparators C3, C4, C5, C6, C7 may compare voltages at a plurality of nodes N3, N4, N5, N6, N7 between the plurality of pull-up arrays 331, 333, 335, 337, 339 and the plurality of pull-down arrays 341, 343, 345, 347, 349 with the reference voltage VREF. For example, the plurality of comparators C3, C4, C5, C6, C7 may include third through seventh comparators C3, C4, C5, C6, C7. The third comparator C3 may generate a third output signal CR3 by comparing a voltage at a third node N3 between the third pull-up array 331 and the second pull-down array 341 with the reference voltage VREF. The fourth comparator C4 may generate a fourth output signal CR4 by comparing a voltage at a fourth node N4 between the fourth pull-up array 333 and the third pull-down array 343 with the reference voltage VREF. The fifth comparator C5 may generate a fifth output signal CR5 by comparing a voltage at a fifth node N5 between the fifth pull-up array 335 and the fourth pull-down array 345 with the reference voltage VREF. The sixth comparator C6 may generate a sixth output signal CR6 by comparing a voltage at a sixth node N6 between the sixth pull-up array 337 and the fifth pull-down array 347 with the reference voltage VREF. The seventh comparator C7 may generate a seventh output signal CR7 by comparing a voltage at a seventh node N7 between the seventh pull-up array 339 and the sixth pull-down array 349 with the reference voltage VREF.

The decision circuit 360 may determine the final pull-up code FPUC and the final pull-down code FPDC based upon the output signals CR3, CR4, CR5, CR6, CR7 of the plurality of comparators C3, C4, C5, C6, C7. For example, referring to a table 400 illustrated in FIG. 5, in a case 410 where all of the third through seventh output signals CR3, CR4, CR5, CR6, CR7 are '0', the decision circuit 360 may determine the pull-up code IPUC+2 greater than the initial pull-up code IPUC by 2 as the final pull-up code FPUC, and may determine the pull-down code IPDC+2 greater than the initial pull-down code IPDC by 2 as the final pull-down code FPDC. In a case 420 where the third output signal CR3 is '1' and the fourth through seventh output signals CR4, CR5, CR6, CR7 are '0', the decision circuit 360 may determine the pull-up code IPUC+1 greater than the initial pull-up code IPUC by 1 as the final pull-up code FPUC, and may determine the pull-down code IPDC+1 greater than the initial pull-down code IPDC by 1 as the final pull-down code FPDC. In a case 430 where the third and fourth output signals CR3, CR4 are '1' and the fifth through seventh output signals CR5, CR6, CR7 are '0', or in a case 440 where the third through fifth output signals CR3, CR4, CR5 are '1' and the sixth and seventh output signals CR6, CR7 are '0', the decision circuit 360 may determine the initial pull-up code IPUC as the final pull-up code FPUC, and may determine the initial pull-down code IPDC as the final pull-down code FPDC. In a case 450 where the third through sixth output signals CR3, CR4, CR5, CR6 are '1' and the seventh output signal CR7 is '0', the decision circuit 360 may determine the pull-up code IPUC−1 less than the initial pull-up code IPUC by 1 as the final pull-up code FPUC, and may determine the pull-down code IPDC−1 less than the initial pull-down code IPDC by 1 as the final pull-down code FPDC. In a case 460 where all of the third through seventh output signals CR3, CR4, CR5, CR6, CR7 are '1', the decision circuit 360 may determine the pull-up code IPUC−2 less than the initial pull-up code IPUC by 2 as the final pull-up code FPUC, and may determine the pull-down code IPDC−2 less than the initial pull-down code IPDC by 2 as the final pull-down code FPDC. As described above, the final pull-up code FPUC and the final pull-down code FPDC may be generated by using the initial pull-up code IPUC and the initial pull-down code IPDC, and thus the subsequent impedance tuning operation may be completed.

In an exemplary embodiment, the post-processing unit 330 may complete the subsequent impedance tuning operation that generates the final pull-up code FPUC and the final pull-down code FPDC by using the initial pull-up code IPUC and the initial pull-down code IPDC within two clock cycles. For example, the plurality of comparators C3, C4, C5, C6, C7 may output the plurality of output signals CR3, CR4, CR5, CR6, CR7 by comparing the voltages at the plurality of nodes N3, N4, N5, N6, N7 with the reference voltage VREF at a first clock cycle, and the decision circuit 360 may determine the final pull-up code FPUC and the final pull-down code FPDC based upon the plurality of output signals CR3, CR4, CR5, CR6, CR7 of the plurality of comparators C3, C4, C5, C6, C7 at a second clock cycle. A conventional impedance tuning circuit requires hundreds of clock cycles to perform an impedance tuning operation. However, the impedance tuning circuit 300 including the post-processing unit 330 according to exemplary embodiments may perform the subsequent impedance tuning operation within about two clock cycles.

In an exemplary embodiment, at least one of the plurality of pull-up arrays 331, 333, 335, 337, 339 and at least one of the plurality of pull-down arrays 341, 343, 345, 347, 349 may be shared by the calibration unit 310 and the post-processing unit 330. For example, the post-processing unit 330 may use the second pull-up array 317 included in the calibration unit 310 as the fifth pull-up array 335, and may use the first pull-down array 321 included in the calibration unit 310 as the fourth pull-up array 345. Further, in this case, the post-processing unit 330 may use the second comparator 323 included in the calibration unit 310 as the fifth comparator C5.

In an exemplary embodiment, after a first subsequent impedance tuning operation is performed, the final pull-up code FPUC and the final pull-down code FPDC of a second subsequent impedance tuning operation may be generated by using the final pull-up code FPUC and the final pull-down code FPDC generated during the first subsequent impedance tuning operation. For example, a plurality of pull-up codes having the final pull-up code FPUC of the first subsequent impedance tuning operation as a center value and a plurality of pull-down codes having the final pull-down code FPDC of the first subsequent impedance tuning operation as a center value may be applied to the plurality of pull-up arrays 331, 333, 335, 337, 339 and the plurality of pull-down arrays 341, 343, 345, 347, 349, respectively, and thus the post-processing unit 330 may determine the final pull-up code FPUC and the final pull-down code FPDC of the second subsequent impedance tuning operation based upon the final pull-up code FPUC and the final pull-down code FPDC of the first subsequent impedance tuning operation that is previously performed before the second subsequent impedance tuning operation. In an exemplary embodiment, the post-processing unit 330 may determine the final pull-up code FPUC and the final pull-down code FPDC of the first subsequent impedance tuning operation based upon the initial pull-up code IPUC and the initial pull-down code IPDC.

As described above, in the impedance tuning circuit 300 according to an exemplary embodiment, the calibration unit 310 may generate the initial pull-up code IPUC and the initial pull-down code IPDC by performing the calibration operation during the initial impedance tuning operation, and the post-processing unit 330 may generate the final pull-up code FPUC and the final pull-down code FPDC by using the initial pull-up code IPUC and the initial pull-down code IPDC during the subsequent impedance tuning operation. Since the final pull-up code FPUC and the final pull-down code FPDC are generated based upon the initial pull-up code IPUC and the initial pull-down code IPDC during the subsequent impedance tuning operation, the impedance tuning circuit 300 according to exemplary embodiments may reduce the impedance tuning time of the subsequent impedance tuning operation.

Figure 6:
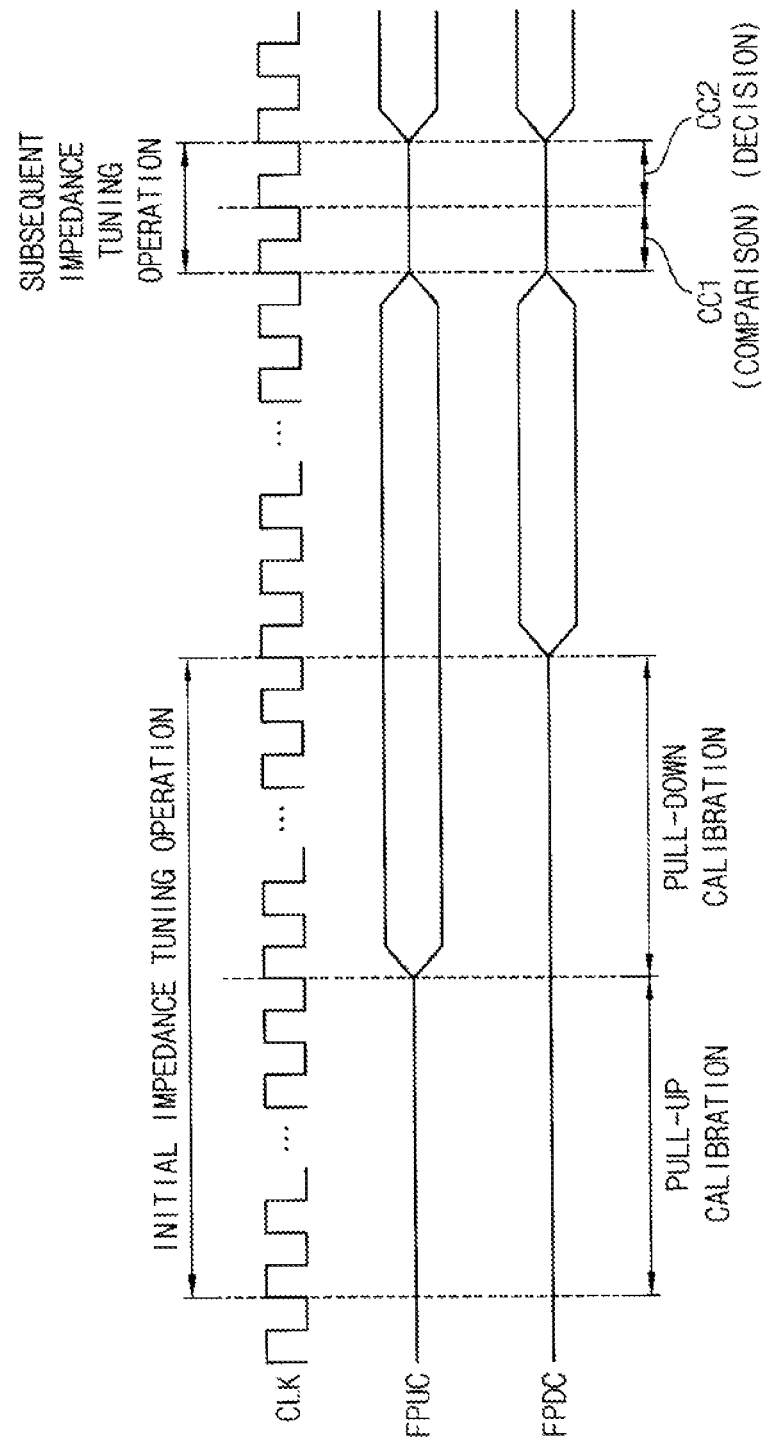
FIG. 6 is a diagram for describing an example of an initial impedance tuning operation and a subsequent impedance tuning operation of an impedance tuning circuit of FIG. 2.

FIG. 6 is a diagram for describing an example of an initial impedance tuning operation and a subsequent impedance tuning operation of an impedance tuning circuit of FIG. 2.

Referring to FIGS. 2 and 6, during an initial impedance tuning operation, a calibration unit 310 may generate an initial pull-up code IPUC by performing a pull-up calibration operation using an external resistor R. After the initial pull-up code IPUC is generated, the calibration unit 310 may generate an initial pull-down code IPDC by performing a pull-down calibration operation. A post-processing unit 330 may output the initial pull-up code IPUC and the initial pull-down code IPDC as a final pull-up code FPUC and a final pull-down code FPDC.

After a predetermined time passes, the impedance tuning circuit 300 may perform a subsequent impedance tuning operation to prevent an impedance mismatch. During the subsequent impedance tuning operation, the calibration unit 310 may not perform the pull-up and pull-down calibration operations, and the post-processing unit 330 may generate the final pull-up code FPUC and the final pull-down code FPDC by using the initial pull-up code IPUC and the initial pull-down code IPDC. The subsequent impedance tuning operation may be completed within two clock cycles CC1, CC2. For example, at a first clock cycle CC1, a plurality of comparators C3, C4, C5, C5, C6 included in the post-processing unit 330 may output a plurality of output signals CR3, CR4, CR5, CR6, CR7 by comparing voltages at a plurality of nodes N3, N4, N5, N6, N7 with a reference voltage VREF. As a second clock cycle CC2, a decision circuit 360 included in the post-processing unit 330 may determine the final pull-up code FPUC and the final pull-down code FPDC based upon the plurality of output signals CR3, CR4, CR5, CR6, CR7 of the plurality of comparators C3, C4, C5, C5, C6.

As described above, the impedance tuning circuit 300 according to exemplary embodiments may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 7:
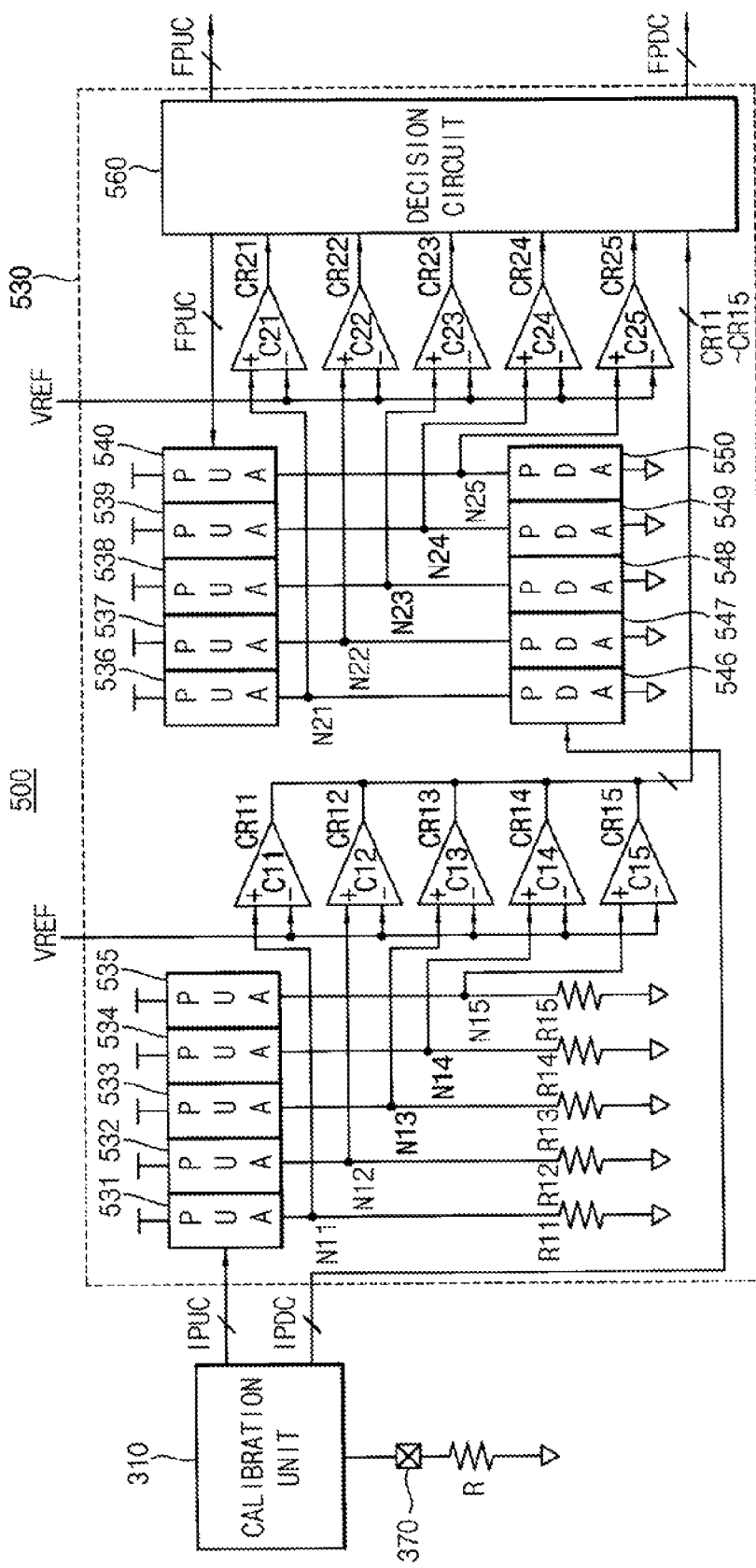
FIG. 7 is a circuit diagram illustrating an impedance tuning circuit according to an exemplary embodiment.

FIG. 7 is a circuit diagram illustrating an impedance tuning circuit according to exemplary embodiments.

Referring to FIG. 7, an impedance tuning circuit 500 includes a calibration unit 310 and a post-processing unit 530.

The calibration unit 310 may generate an initial pull-up code IPUC and an initial pull-down code IPDC by performing a calibration operation using an external resistor R during an initial impedance tuning operation, and during a subsequent impedance tuning operation may utilize such initial codes without the necessity of again performing the calibration operation.

The post-processing unit 530 may output the initial pull-up code IPUC and the initial pull-down code IPDC as a final pull-up code FPUC and a final pull-down code FPDC during the initial impedance tuning operation, and may generate the final pull-up code FPUC and the final pull-down code FPDC by using the initial pull-up code IPUC and the initial pull-down code IPDC during the subsequent impedance tuning operation. The post-processing unit 530 may include a plurality of first pull-up arrays 531, 532, 533, 534, 535, a plurality of first comparators C11, C12, C13, C14, C15, a plurality of second pull-up arrays 536, 537, 538, 539, 540, a plurality of pull-down arrays 546, 547, 548, 549, 550, a plurality of second comparators C21, C22, C23, C24, C25 and a decision circuit 560.

The plurality of first pull-up arrays 531, 532, 533, 534, 535 may be coupled to a plurality of resistors R11, R12, R13, R14, R15, respectively. The plurality of first pull-up arrays 531, 532, 533, 534, 535 may receive a plurality of pull-up codes having the initial pull-up code IPUC as a center value from the calibration unit 310 or from the decision circuit 560, and may have a plurality of pull-up impedances corresponding to the plurality of pull-up codes.

The plurality of first comparators C11, C12, C13, C14, C15 may generate a plurality of first output signals CR11, CR12, CR13, CR14, CR15 by comparing voltages at a plurality of first nodes N11, N12, N13, N14, N15 between the plurality of first pull-up arrays 531, 532, 533, 534, 535 and the plurality of resistors R1, R2, R3, R4, R5 with a reference voltage VREF.

The decision circuit 560 may determine the final pull-up code FPUC based upon the plurality of first output signals CR11, CR12, CR13, CR14, CR15 of the plurality of first comparators C11, C12, C13, C14, C15. For example, the decision circuit 560 may select as the final pull-up code FPUC a pull-up code that is applied to a pull-up array coupled to a node of which a voltage is substantially equal to the reference voltage VREF.

The decision circuit 560 may apply the final pull-up code FPUC to the plurality of second pull-up arrays 536, 537, 538, 539, 540, and the plurality of second pull-up arrays 536, 537, 538, 539, 540 may have a pull-up impedance corresponding to the final pull-up code FPUC.

The plurality of pull-down arrays 546, 547, 548, 549, 550 may be coupled to the plurality of second pull-up arrays 536, 537, 538, 539, 540, respectively. The plurality of pull-down arrays 546, 547, 548, 549, 550 may receive a plurality of pull-down codes having the initial pull-down code IPDC as a center value from the calibration unit 310 or from the decision circuit 560, and may have a plurality of pull-down impedances corresponding to the plurality of pull-down codes.

The plurality of second comparators C21, C22, C23, C24, C25 may generate a plurality of second output signals CR21, CR22, CR23, CR24, CR25 by comparing voltages at a plurality of second nodes N21, N22, N23, N24, N25 between the plurality of second pull-up arrays 536, 537, 538, 539, 540 and the plurality of pull-down arrays 546, 547, 548, 549, 550 with the reference voltage VREF.

The decision circuit 560 may determine the final pull-down code FPDC based upon the plurality of second output signals CR21, CR22, CR23, CR24, CR25 of the plurality of second comparators C21, C22, C23, C24, C25. For example, the decision circuit 560 may select as the final pull-down code FPDC a pull-down code that is applied to a pull-down array coupled to a node of which a voltage is substantially equal to the reference voltage VREF.

In an exemplary embodiment, the post-processing unit 530 may complete the subsequent impedance tuning operation that generates the final pull-up code FPUC and the final pull-down code FPDC by using the initial pull-up code IPUC and the initial pull-down code IPDC within four clock cycles. For example, the plurality of first comparators C11, C12, C13, C14, C15 may output the plurality of first output signals CR11, CR12, CR13, CR14, CR15 by comparing the voltages at the plurality of first nodes N11, N12, N13, N14, N15 with the reference voltage VREF at a first clock cycle. The decision circuit 560 may determine the final pull-up code FPUC based upon the plurality of first output signals CR11, CR12, CR13, CR14, CR15 of the plurality of first comparators C11, C12, C13, C14, C15 at a second clock cycle. The plurality of second comparators C21, C22, C23, C24, C25 may output the plurality of second output signals CR21, CR22, CR23, CR24, CR25 by comparing the voltages at the plurality of second nodes N21, N22, N23, N24, N25 with the reference voltage VREF at a third clock cycle. The decision circuit 560 may determine the final pull-down code FPDC based upon the plurality of second output signals CR21, CR22, CR23, CR24, CR25 of the plurality of second comparators C21, C22, C23, C24, C25 at a fourth clock cycle.

In an exemplary embodiment, one of the plurality of resistors R11, R12, R13, R14 and R15 may be the external resistor R. Further, in an exemplary embodiment, at least one of the plurality of first pull-up arrays 531, 532, 533, 534, 535 and the plurality of first pull-up arrays 531, 532, 533, 534, 535, and at least one of the plurality of pull-down arrays 546, 547, 548, 549, 550 may be shared by the calibration unit 310 and the post-processing unit 530.

As described above, the impedance tuning circuit 500 according to an exemplary embodiment may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 8:
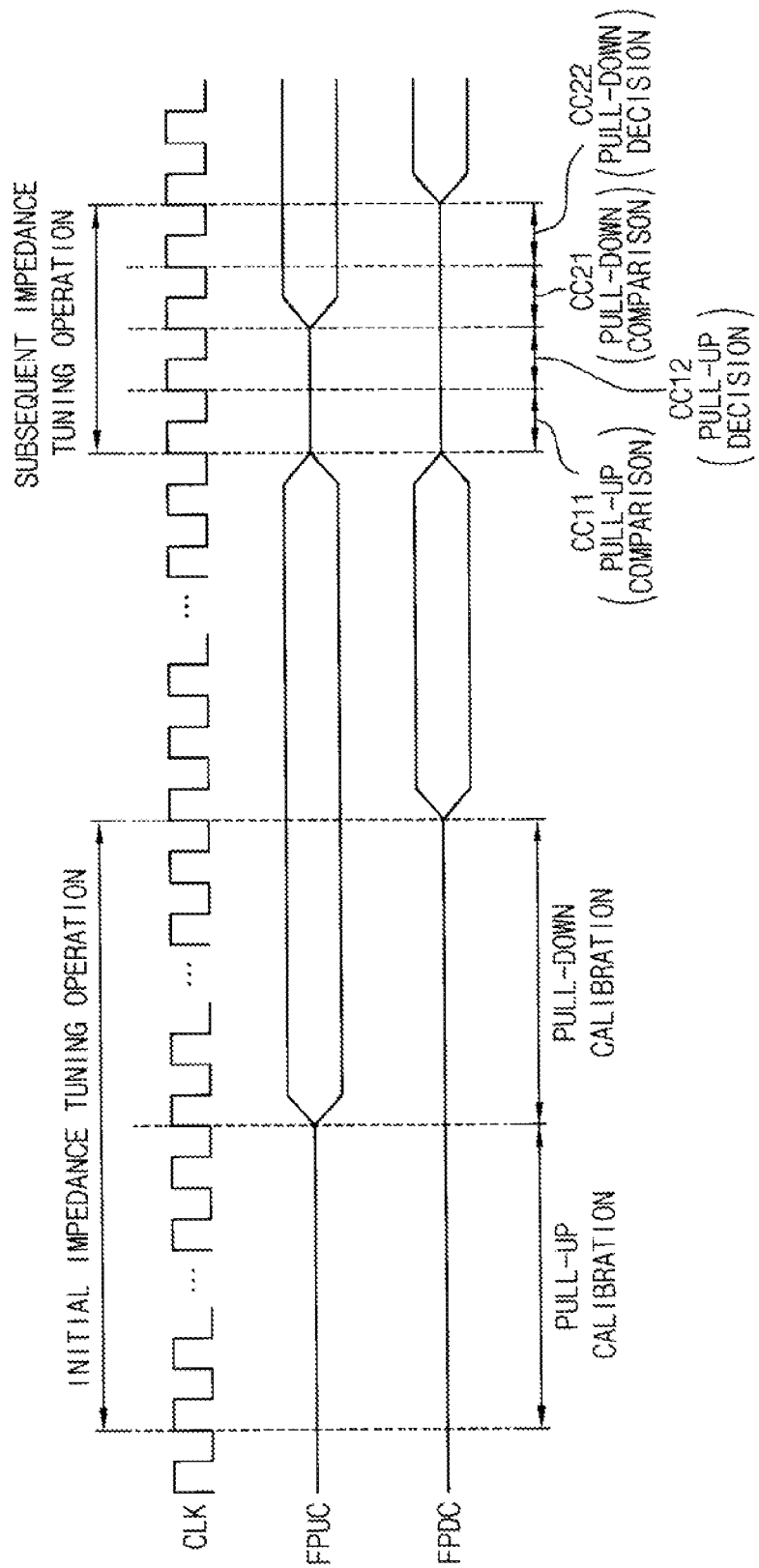
FIG. 8 is a diagram for describing an example of an initial impedance tuning operation and a subsequent impedance tuning operation of an impedance tuning circuit of FIG. 7.

FIG. 8 is a diagram for describing an example of an initial impedance tuning operation and a subsequent impedance tuning operation of an impedance tuning circuit of FIG. 7.

Referring to FIGS. 7 and 8, during an initial impedance tuning operation, a calibration unit 310 may generate an initial pull-up code IPUC by performing a pull-up calibration operation using an external resistor R. After the initial pull-up code IPUC is generated, the calibration unit 310 may generate an initial pull-down code IPDC by performing a pull-down calibration operation. A post-processing unit 530 may output the initial pull-up code IPUC and the initial pull-down code IPDC as a final pull-up code FPUC and a final pull-down code FPDC.

After a predetermined time passes, the impedance tuning circuit 500 may perform a subsequent impedance tuning operation to prevent an impedance mismatch. During the subsequent impedance tuning operation, the calibration unit 310 may not perform the pull-up and pull-down calibration operations, and the post-processing unit 530 may generate the final pull-up code FPUC and the final pull-down code FPDC by using the initial pull-up code IPUC and the initial pull-down code IPDC. The subsequent impedance tuning operation may be completed within four clock cycles CC11, CC12, CC21, CC22. For example, to perform the subsequent impedance tuning operation, the post-processing unit 530 may perform a pull-up comparison operation at a first clock cycle CC11, may perform a pull-up decision operation at a second clock cycle CC12, may perform a pull-down comparison operation at a third clock cycle CC21, and may perform a pull-down decision operation at a fourth clock cycle CC22.

As described above, the impedance tuning circuit 500 according to an exemplary embodiment may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 9:
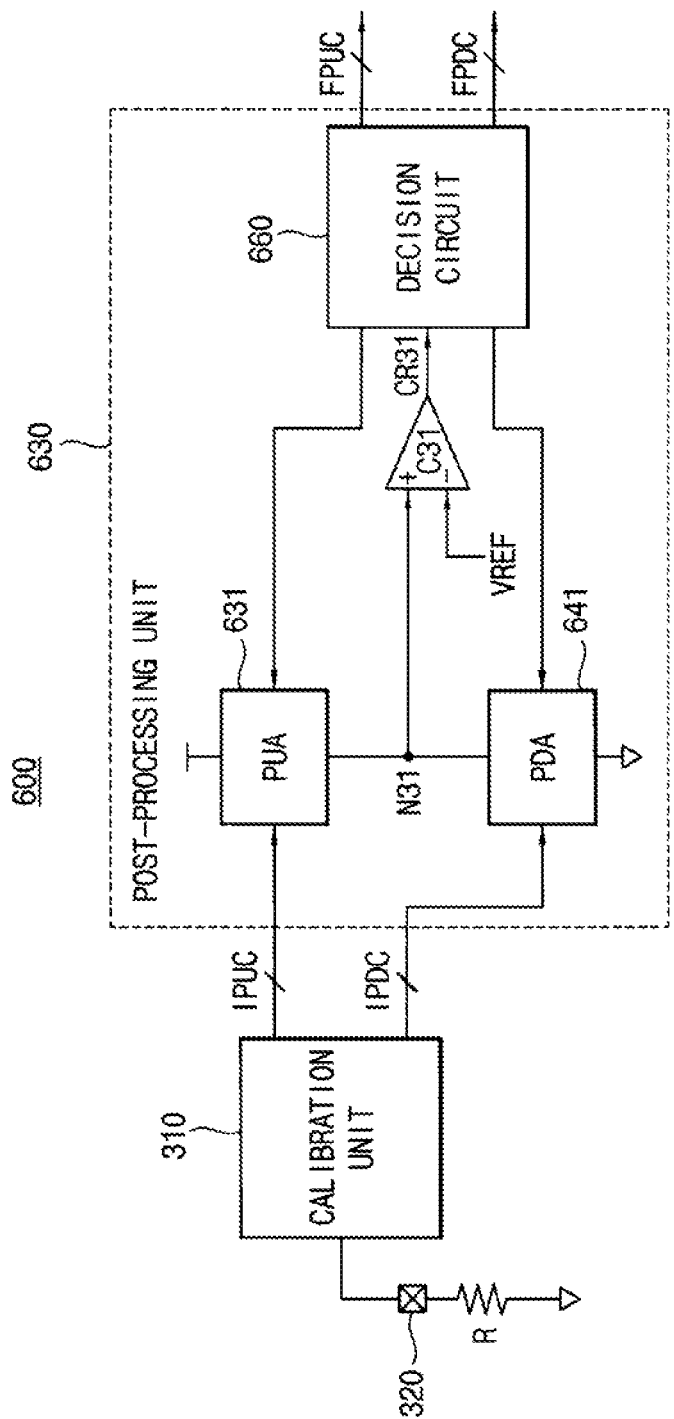
FIG. 9 is a circuit diagram illustrating an impedance tuning circuit according to an exemplary embodiment.

FIG. 9 is a circuit diagram illustrating an impedance tuning circuit according to an exemplary embodiment.

Referring to FIG. 9, an impedance tuning circuit 600 includes a calibration unit 310 and a post-processing unit 630.

The calibration unit 310 may generate an initial pull-up code IPUC and an initial pull-down code IPDC by performing a calibration operation using an external resistor R during an initial impedance tuning operation, and during a subsequent impedance tuning operation may utilize such initial codes without the necessity of again performing the calibration operation.

The post-processing unit 630 may output the initial pull-up code IPUC and the initial pull-down code IPDC as a final pull-up code FPUC and a final pull-down code FPDC during the initial impedance tuning operation, and may generate the final pull-up code FPUC and the final pull-down code FPDC by using the initial pull-up code IPUC and the initial pull-down code IPDC during the subsequent impedance tuning operation. The post-processing unit 630 may include a pull-up array 631, a pull-down array 641, a comparator C31 and a decision circuit 660.

The pull-up array 631 may sequentially receive a plurality of pull-up codes having the initial pull-up code IPUC as a center value from the calibration unit 310 or from the decision circuit 660, and may sequentially have a plurality of pull-up impedances corresponding to the plurality of pull-up codes. For example, during the subsequent impedance tuning operation, the pull-up array 631 may receive the initial pull-up code IPUC from the calibration unit 310 or from the decision circuit 660 at a first clock cycle, and may sequentially receive pull-up codes that are increased or decreased from the initial pull-up code IPUC from the calibration unit 310 or from the decision circuit 660 at subsequent clock cycles.

The pull-down array 641 may be coupled to the pull-up array 631. The pull-down array 641 may sequentially receive a plurality of pull-down codes having the initial pull-down code IPDC as a center value from the calibration unit 310 or from the decision circuit 660, and may sequentially have a plurality of pull-down impedances corresponding to the plurality of pull-down codes. For example, during the subsequent impedance tuning operation, the pull-down array 641 may receive the initial pull-down code IPDC from the calibration unit 310 or from the decision circuit 660 at a first clock cycle, and may sequentially receive pull-down codes that are increased or decreased from the initial pull-down code IPDC from the calibration unit 310 or from the decision circuit 660 at subsequent clock cycles.

The comparator C31 may sequentially generate a plurality of output signals CR31 by comparing a voltage at a node N31 between the pull-up array 631 and the pull-down array 641 with a reference voltage VREF.

The decision circuit 660 may determine the final pull-up code FPUC and the final pull-down code FPDC based upon the plurality of output signals CR31 sequentially output from the comparator C31.

In an exemplary embodiment, the pull-up array 631, the pull-down array 641 and the comparator C31 may be shared by the calibration unit 310 and the post-processing unit 630. For example, the post-processing unit 630 may include only the decision circuit 660, and may use a pull-up array, a pull-down array and a comparator included in the calibration unit 310 as the pull-up array 631, the pull-down array 641 and the comparator C31.

As described above, the impedance tuning circuit 600 according to an exemplary embodiment may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 10:
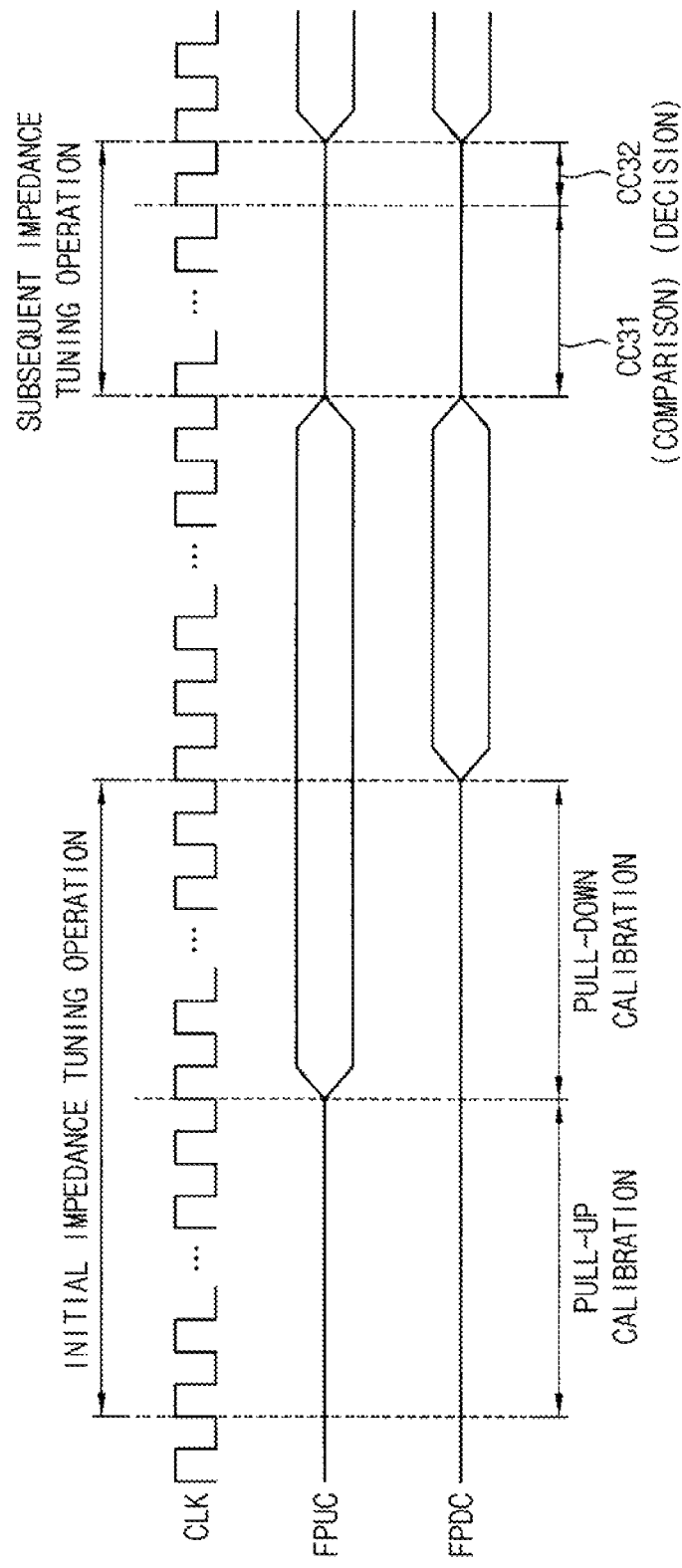
FIG. 10 is a diagram for describing an example of an initial impedance tuning operation and a subsequent impedance tuning operation of an impedance tuning circuit of FIG. 9.

FIG. 10 is a diagram for describing an example of an initial impedance tuning operation and a subsequent impedance tuning operation of an impedance tuning circuit of FIG. 9.

Referring to FIGS. 9 and 10, during an initial impedance tuning operation, a calibration unit 310 may generate an initial pull-up code IPUC by performing a pull-up calibration operation using an external resistor R. After the initial pull-up code IPUC is generated, the calibration unit 310 may generate an initial pull-down code IPDC by performing a pull-down calibration operation. A post-processing unit 630 may output the initial pull-up code IPUC and the initial pull-down code IPDC as a final pull-up code FPUC and a final pull-down code FPDC.

After a predetermined time passes, the impedance tuning circuit 600 may perform a subsequent impedance tuning operation to prevent an impedance mismatch. During the subsequent impedance tuning operation, the calibration unit 310 may not perform the pull-up and pull-down calibration operations, and the post-processing unit 630 may generate the final pull-up code FPUC and the final pull-down code FPDC by using the initial pull-up code IPUC and the initial pull-down code IPDC. The subsequent impedance tuning operation may be completed within a predetermined number of clock cycles CC31, CC32. For example, to perform the subsequent impedance tuning operation, the post-processing unit 630 may perform a comparison operation at first clock cycles CC31, and may perform a decision operation at a second clock cycle CC32. The number of the first clock cycles CC31 may correspond to the number of pull-up codes applied to the pull-up array 631 or the number of pull-down codes applied to the pull-down array 641. For example, the number of the first clock cycles CC31 may be tens of clock cycles or less.

As described above, the impedance tuning circuit 600 according to exemplary embodiments may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 11:
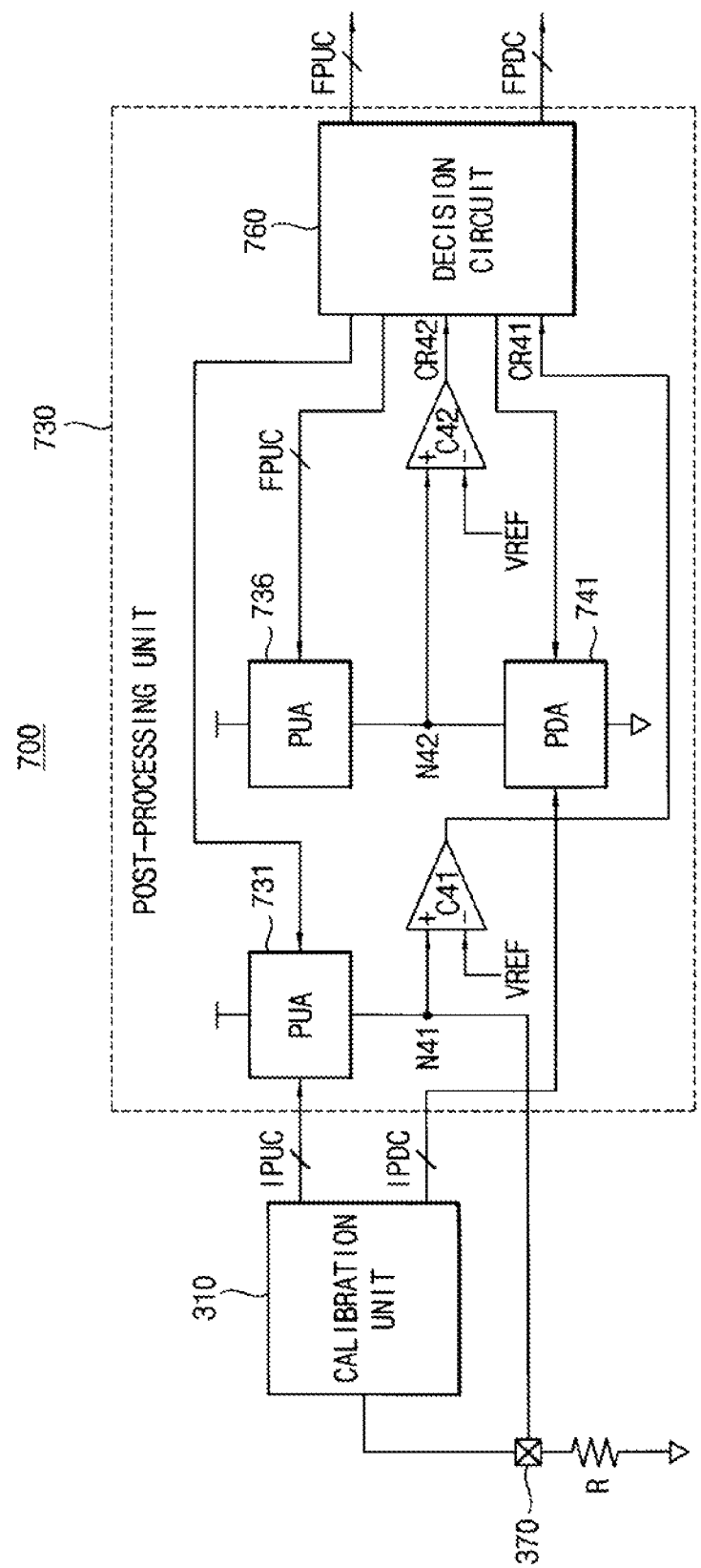
FIG. 11 is a circuit diagram illustrating an impedance tuning circuit according to an exemplary embodiment.

FIG. 11 is a circuit diagram illustrating an impedance tuning circuit according to exemplary embodiments.

Referring to FIG. 11, an impedance tuning circuit 700 includes a calibration unit 310 and a post-processing unit 730.

The calibration unit 310 may generate an initial pull-up code IPUC and an initial pull-down code IPDC by performing a calibration operation using an external resistor R during an initial impedance tuning operation, and may not perform the calibration operation during a subsequent impedance tuning operation.

The post-processing unit 730 may output the initial pull-up code IPUC and the initial pull-down code IPDC as a final pull-up code FPUC and a final pull-down code FPDC during the initial impedance tuning operation, and may generate the final pull-up code FPUC and the final pull-down code FPDC by using the initial pull-up code IPUC and the initial pull-down code IPDC during the subsequent impedance tuning operation. The post-processing unit 730 may include a first pull-up array 731, a first comparator C41, a second pull-up array 736, a pull-down array 741, a second comparator C42 and a decision circuit 760.

The first pull-up array 731 may be coupled to the external resistor R through a pad 370. The first pull-up array 731 may sequentially receive a plurality of pull-up codes having the initial pull-up code IPUC as a center value from the calibration unit 310 or from the decision circuit 760, and may sequentially have a plurality of pull-up impedances corresponding to the plurality of pull-up codes.

The first comparator C41 may sequentially generate a plurality of first output signals CR41 by comparing a voltage at a first node N41 between the first pull-up array 731 and the external resistor R with a reference voltage VREF.

The decision circuit 760 may determine the final pull-up code FPUC based upon the plurality of first output signals CR41 sequentially output from the first comparator C41. For example, the decision circuit 760 may determine, as the final pull-up code FPUC, a pull-up code applied when the voltage at the first node N41 becomes substantially the same as the reference voltage VREF. The decision circuit 760 may apply the final pull-up code FPUC to the second pull-up array 736.

The second pull-up array 736 may have a pull-up impedance corresponding to the final pull-up code FPUC in response to the final pull-up code FPUC received from the decision circuit 760.

The pull-down array 741 may be coupled to the second pull-up array 736. The pull-down array 741 may sequentially receive a plurality of pull-down codes having the initial pull-down code IPDC as a center value from the calibration unit 310 or from the decision circuit 760, and may sequentially have a plurality of pull-down impedances corresponding to the plurality of pull-down codes.

The second comparator C42 may sequentially generate a plurality of second output signals CR42 by comparing a voltage at a second node N42 between the second pull-up array 736 and the pull-down array 741 with the reference voltage VREF.

The decision circuit 760 may determine the final pull-down code FPDC based upon the plurality of second output signals CR42 sequentially output from the second comparator C42. For example, the decision circuit 760 may determine, as the final pull-down code FPDC, a pull-down code applied when the voltage at the second node N42 becomes substantially the same as the reference voltage VREF.

In an exemplary embodiment, the first pull-up array 731, the first comparator C41, the second pull-up array 736, the pull-down array 741 and the second comparator C42 may be shared by the calibration unit 310 and the post-processing unit 730.

As described above, the impedance tuning circuit 700 according to exemplary embodiments may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 12:
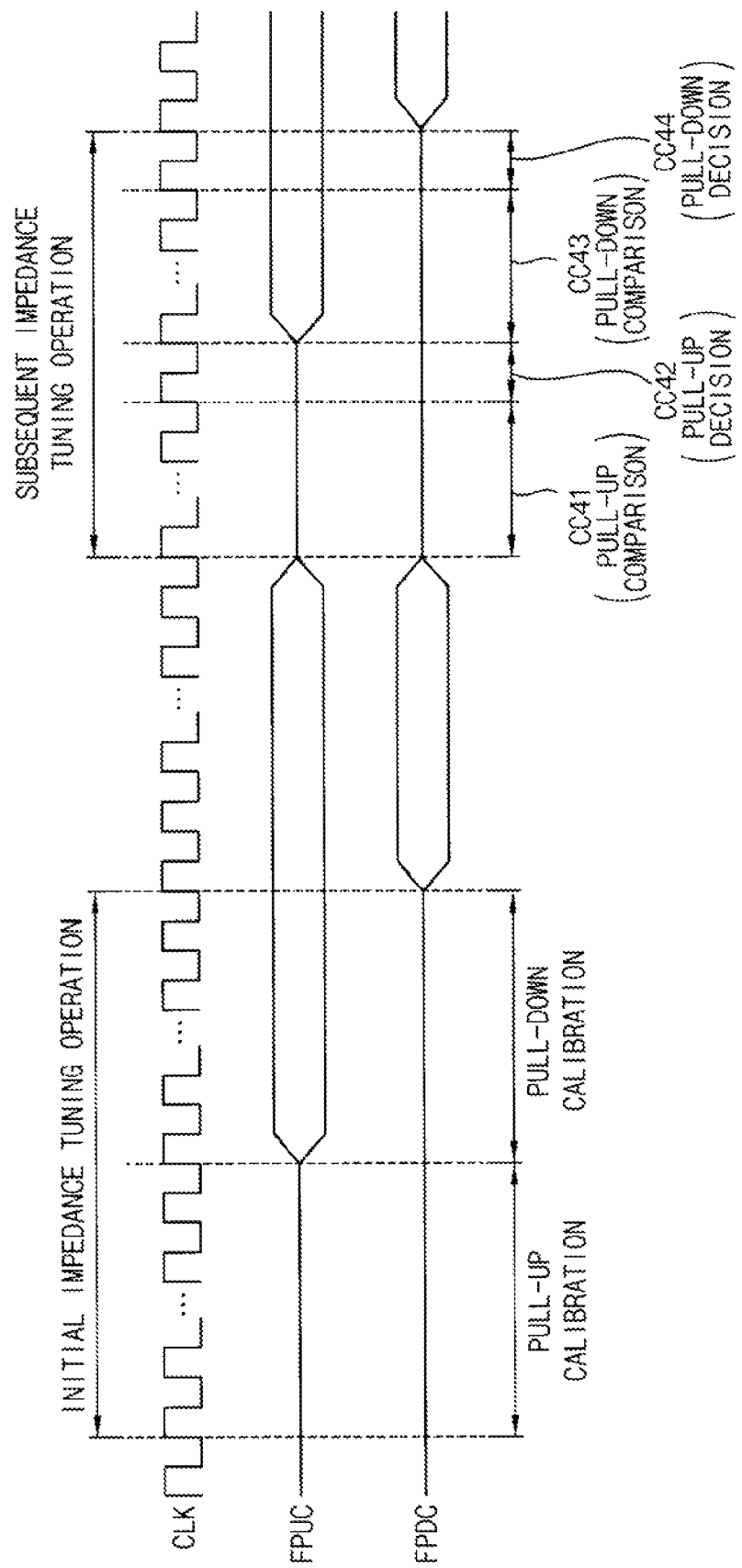
FIG. 12 is a diagram for describing an example of an initial impedance tuning operation and a subsequent impedance tuning operation of an impedance tuning circuit of FIG. 11.

FIG. 12 is a diagram for describing an example of an initial impedance tuning operation and a subsequent impedance tuning operation of an impedance tuning circuit of FIG. 11.

Referring to FIGS. 11 and 12, during an initial impedance tuning operation, a calibration unit 310 may generate an initial pull-up code IPUC by performing a pull-up calibration operation using an external resistor R. After the initial pull-up code IPUC is generated, the calibration unit 310 may generate an initial pull-down code IPDC by performing a pull-down calibration operation. A post-processing unit 730 may output the initial pull-up code IPUC and the initial pull-down code IPDC as a final pull-up code FPUC and a final pull-down code FPDC.

After a predetermined time passes, the impedance tuning circuit 700 may perform a subsequent impedance tuning operation to prevent an impedance mismatch. During the subsequent impedance tuning operation, the calibration unit 310 may not perform the pull-up and pull-down calibration operations, and the post-processing unit 730 may generate the final pull-up code FPUC and the final pull-down code FPDC by using the initial pull-up code IPUC and the initial pull-down code IPDC. The subsequent impedance tuning operation may be completed within a predetermined number of clock cycles CC41, CC42, CC43, CC44. For example, to perform the subsequent impedance tuning operation, the post-processing unit 730 may perform a pull-up comparison operation at first clock cycles CC41, may perform a pull-up decision operation at a second clock cycle CC42, may perform a pull-down comparison operation at third clock cycles CC43, and may perform a pull-down decision operation at a fourth clock cycle CC44. The number of the first clock cycles CC41 or the number of the third clock cycles CC43 may correspond to the number of pull-up codes applied to the first pull-up array 731 or the number of pull-down codes applied to the pull-down array 741. For example, the number of the first clock cycles CC41 or the number of the third clock cycles CC43 may be tens of clock cycles or less.

As described above, the impedance tuning circuit 700 according to exemplary embodiments may generate the final pull-up code FPUC and the final pull-down code FPDC by using the initial pull-up code IPUC and the initial pull-down code IPDC during the subsequent impedance tuning operation, thereby reducing the impedance tuning time of the subsequent impedance tuning operation.

Figure 13:
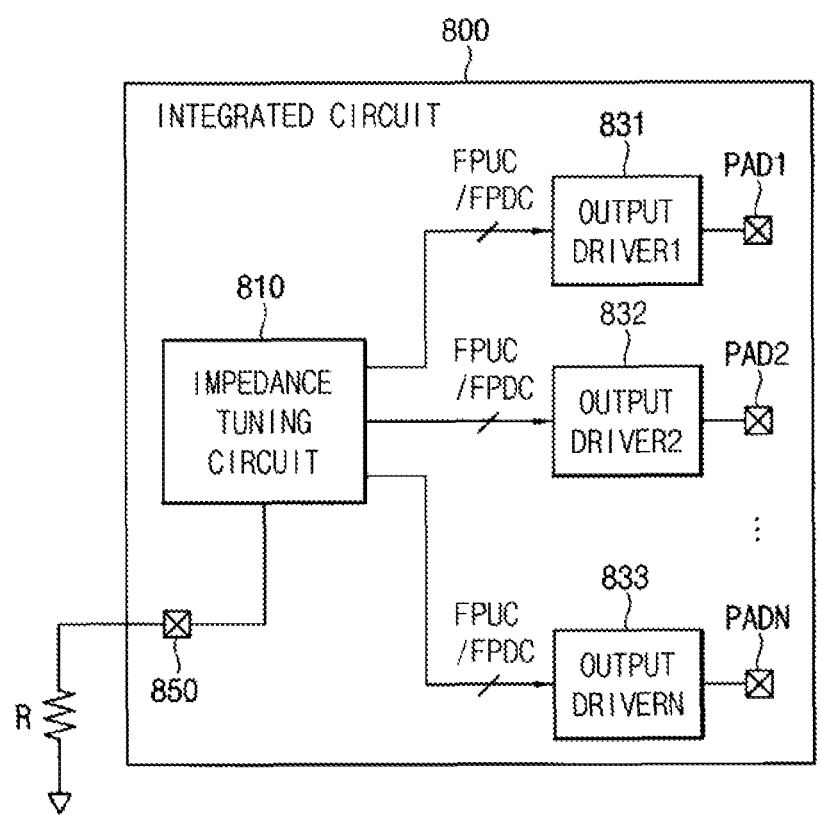
FIG. 13 is a block diagram illustrating an integrated circuit according to an exemplary embodiment.

FIG. 13 is a block diagram illustrating an integrated circuit according to exemplary embodiments.

Referring to FIG. 13, an integrated circuit 800 includes at least one impedance tuning circuit 810 and a plurality of output drivers 831, 832, 833. FIG. 13 illustrates an example where one impedance tuning circuit 810 adjusts impedances of the plurality of output drivers 831, 832, 833. According to an exemplary embodiment, the integrated circuit 800 may be a system-on-chip (SOC), a mobile SOC, a processor, a memory controller, a memory device, etc.

The impedance tuning circuit 810 may be coupled to an external resistor R located outside the integrated circuit 800 through a pad 850. The impedance tuning circuit 810 may perform an initial impedance tuning operation that generates initial pull-up and pull-down codes by using the external resistor R, and may perform a subsequent impedance tuning operation that generates final pull-up and pull-down codes FPUC, FPDC by using the initial pull-up and pull-down codes generated during the initial impedance tuning operation. The impedance tuning circuit 810 may provide the final pull-up and pull-down codes FPUC, FPDC to the plurality of output drivers 831, 832, 833.

The plurality of output drivers 831, 832, 833 may have output pull-up and pull-down impedances corresponding to the final pull-up and pull-down codes FPUC, FPDC in response to the final pull-up and pull-down codes FPUC, FPDC received from the impedance tuning circuit 810. Accordingly, the plurality of output drivers 831, 832, 833 may transmit signals without distortion through a plurality of pads PAD1, PAD2, PADN.

Although FIG. 13 illustrates an example where the impedance tuning circuit 810 provides the final pull-up and pull-down codes FPUC, FPDC to the plurality of output drivers 831, 832, 833, according to an exemplary embodiment, the final pull-up and pull-down codes FPUC, FPDC generated by the impedance tuning circuit 810 may, alternatively, be provided to at least one termination circuit, and/or at least one merged driver where a termination circuit and an output driver are merged into an integrated unit.

Figure 14:
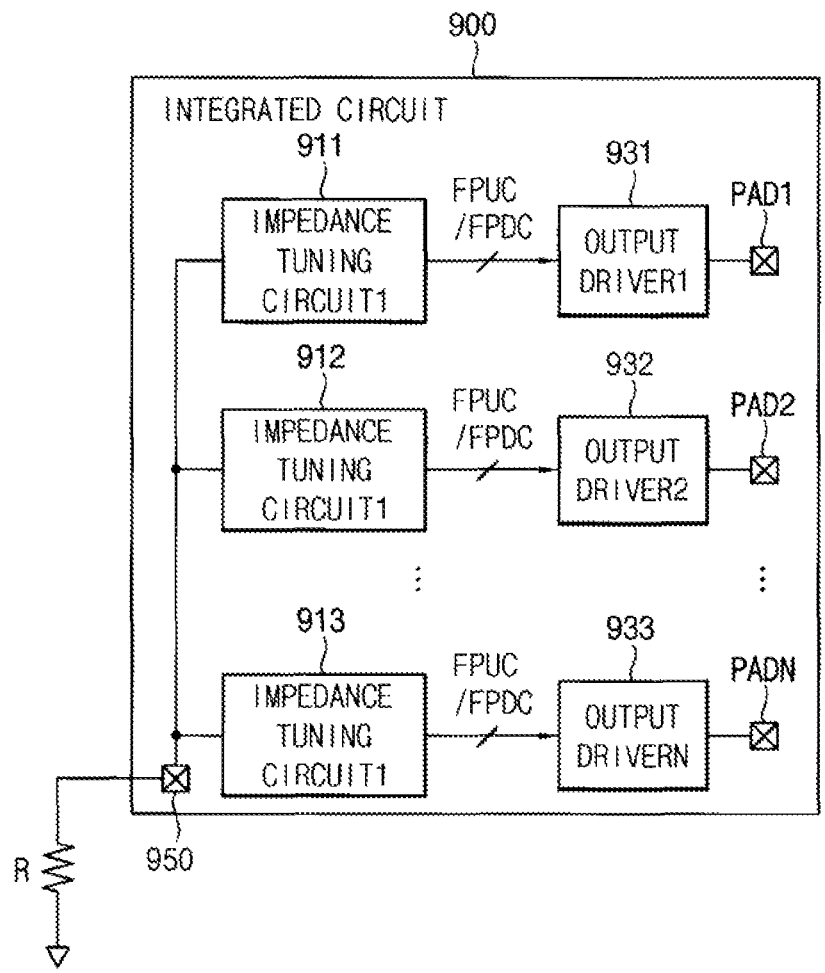
FIG. 14 is a block diagram illustrating an integrated circuit according to an exemplary embodiment.

FIG. 14 is a block diagram illustrating an integrated circuit according to exemplary embodiments.

Referring to FIG. 14, an integrated circuit 900 includes a plurality of impedance tuning circuits 911, 912, 913 and a plurality of output drivers 931, 932, 933. FIG. 14 illustrates an example where the plurality of impedance tuning circuits 911, 912, 913 adjust impedances of the plurality of output drivers 931, 932, 933, respectively. According to an exemplary embodiment, the integrated circuit 900 may be a system-on-chip (SOC), a mobile SOC, a processor, a memory controller, a memory device, etc.

The plurality of impedance tuning circuits 911, 912, 913 may be coupled to an external resistor R located outside the integrated circuit 900 through a pad 950. Each impedance tuning circuit 911, 912, 913 may perform an initial impedance tuning operation that generates initial pull-up and pull-down codes by using the external resistor R, and may perform a subsequent impedance tuning operation that generates final pull-up and pull-down codes FPUC, FPDC by using the initial pull-up and pull-down codes generated during the initial impedance tuning operation. The plurality of impedance tuning circuits 911, 912, 913 may provide the final pull-up and pull-down codes FPUC, FPDC to the plurality of output drivers 911, 912, 913, respectively.

The plurality of output drivers 911, 912, 913 may have output pull-up and pull-down impedances corresponding to the final pull-up and pull-down codes FPUC and FPDC in response to the final pull-up and pull-down codes FPUC, FPDC received from the plurality of impedance tuning circuits 911, 912, 913. Accordingly, the plurality of output drivers 911, 912, 913 may transmit signals without distortion through a plurality of pads PAD1, PAD2, PADN.

Figure 15:
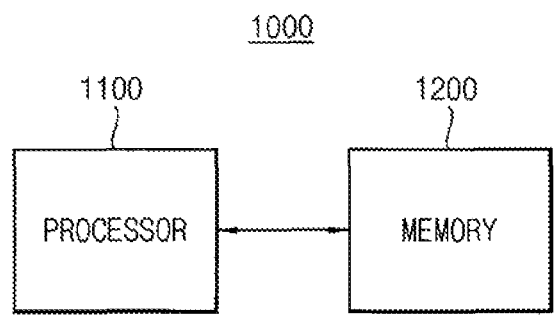
FIG. 15 is a block diagram illustrating a computing system according to an exemplary embodiment.

FIG. 15 is a block diagram illustrating a computing system according to an exemplary embodiment.

Referring to FIG. 15, a computing system 1000 includes a processor 1100 and a memory device 1200.

The processor 1100 may perform specific calculations or tasks. For example, the processor 1100 may be an SOC, a mobile SOC, an application processor (AP), a media processor, a digital signal processor (DSP), a microprocessor, a central processing unit (CPU), or the like. The processor 1100 may include at least one first impedance tuning circuit. The first impedance tuning circuit may perform an initial impedance tuning operation that generates initial pull-up and pull-down codes by using the external resistor R, and may perform a subsequent impedance tuning operation that generates final pull-up and pull-down codes by using the initial pull-up and pull-down codes generated during the initial impedance tuning operation. Accordingly, an impedance tuning time of the subsequent impedance tuning operation may be reduced. The final pull-up and pull-down codes generated by the first impedance tuning circuit may be provided to at least one output driver and/or at least one termination circuit included in the processor 1100. The processor 1100 may accurately transmit data to the memory device 1200 via the output driver with a tuned output impedance, and may accurately receive data from the memory device 1200 via a receiving buffer coupled to the termination circuit with a tuned termination impedance.

The memory device 1200 may store data received from the processor 1100, and may provide the stored data to the processor 1100. For example, the memory device 1200 may be implemented by a dynamic random access memory (DRAM), a static random access memory (SRAM), a phase random access memory (PRAM), a ferroelectric random access memory (FRAM), a resistive random access memory (RRAM), a magnetic random access memory (MRAM), etc. The memory device 1200 may include at least one second impedance tuning circuit. The second impedance tuning circuit may perform an initial impedance tuning operation that generates initial pull-up and pull-down codes by using the external resistor R, and may perform a subsequent impedance tuning operation that generates final pull-up and pull-down codes by using the initial pull-up and pull-down codes generated during the initial impedance tuning operation. Accordingly, an impedance tuning time of the subsequent impedance tuning operation may be reduced. The final pull-up and pull-down codes generated by the second impedance tuning circuit may be provided to at least one output driver and/or at least one termination circuit included in the memory device 1200.

In an exemplary embodiment, the computing system 1000 may further include a user interface including at least one input device, such as a keyboard, a mouse, a touch screen, etc. and at least one output device, such as a printer, a display device, etc., a modem (e.g., a baseband chipset), an application chipset, a camera image processor (CIS), etc.

As described above, the processor 1100 and/or the memory device 1200 may include an impedance tuning circuit according to an exemplary embodiment, and thus signals between the processor 1100 and the memory device 1200 may be accurately transferred without distortion. Further, since the impedance tuning circuit according to exemplary embodiments can reduce the time needed for impedance tuning, the performance of the entire system 1000 can be improved.

According to an exemplary embodiment, the computing system 1000 may be any computing system, such as a desktop computer, a laptop computer, a tablet computer, a mobile phone, a smart phone, a music player, a personal digital assistants (PDA), a portable multimedia player (PMP), a digital television, a digital camera, a portable game console, etc.

In an exemplary embodiment, the processor 1100 and/or the memory device 1200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The inventive concept may be applied to any integrated circuit and any computing system performing a chip-to-chip interface. For example, the inventive concept may be applied to various electronic devices, such as a desktop computer, a laptop computer, a tablet computer, a mobile phone, a smart phone, a music player, a PDA, a PMP, a digital television, a digital camera, a portable game console, etc.

Although exemplary embodiments have been described, those skilled in the art will readily appreciate that many modifications are possible to the exemplary embodiments without materially departing from the novel teachings and advantages of the present inventive concept. Accordingly, the exemplary embodiments, all such modifications, as well as other exemplary embodiments, are intended to be included within the scope of the appended claims.

What is claimed is:

1. An impedance tuning circuit, comprising:
   a calibration unit configured to generate an initial pull-up code and an initial pull-down code by performing a calibration operation using an external resistor during an initial impedance tuning operation; and
   a post-processing unit configured to output the initial pull-up code and the initial pull-down code as a final pull-up code and a final pull-down code during the initial impedance tuning operation, and configured to generate the final pull-up code and the final pull-down code by using the initial pull-up code and the initial pull-down code during a subsequent impedance tuning operation without external control having been applied to the calibration unit to stop the calibration operation after the initial impedance tuning operation, wherein the post-processing unit comprises:
- a plurality of pull-up arrays configured to receive a plurality of pull-up codes having the initial pull-up code as a center value, and configured to have a plurality of pull-up impedances respectively corresponding to the plurality of pull-up codes;
- a plurality of pull-down arrays respectively coupled to the plurality of pull-up arrays, the plurality of pull-down arrays configured to receive a plurality of pull-down codes having the initial pull-down code as a center value, and configured to have a plurality of pull-down impedances respectively corresponding to the plurality of pull-down codes;
- a plurality of comparators configured to generate a plurality of output signals by comparing voltages at a plurality of nodes between the plurality of pull-up arrays and the plurality of pull-down arrays with a reference voltage; and
- a decision circuit configured to determine the final pull-up code and the final pull-down code based upon the plurality of output signals of the plurality of comparators.

2. The impedance tuning circuit of claim 1, wherein the calibration unit comprises:
- a first pull-up array coupled to the external resistor;
- a first comparator configured to compare a voltage at a first node between the first pull-up array and the external resistor with a reference voltage;
- a pull-up finite state machine configured to generate the initial pull-up code based upon an output signal of the first comparator;
- a second pull-up array configured to have a pull-up impedance corresponding to the initial pull-up code in response to the initial pull-up code generated by the pull-up finite state machine;
- a pull-down array coupled to the second pull-up array;
- a second comparator configured to compare a voltage at a second lode between the second pull-up array and the pull-down array with the reference voltage; and
- a pull-down finite state machine configured to generate the initial pull-down code based upon an output signal of the second comparator.

3. The impedance tuning circuit of claim 1, wherein the post-processing unit is configured to complete the subsequent impedance tuning operation within two clock cycles.

4. The impedance tuning circuit of claim 1, wherein, during the subsequent impedance tuning operation, the post-processing unit compares the voltages at the plurality of nodes with the reference voltage at a first clock cycle, and determines the final pull-up code and the final pull-down code based upon a result of the comparison at a second clock cycle.

5. The impedance tuning circuit of claim 1, wherein at least one of the plurality of pull-up arrays and at least one of the plurality of pull-down arrays are shared by the calibration unit and the processing unit.

6. An integrated circuit, comprising:
- at least one pad;
- at least one output driver configured to transmit a signal through the at least one pad; and
- an impedance tuning circuit configured to apply a final pull-up code and a final pull-down code to the at least, one output driver to adjust an impedance of the at least one output driver, the impedance tuning circuit comprising:
  - a calibration unit configured to generates an initial pull-up code and an initial pull-down code by performing a calibration operation using an external resistor during an initial impedance tuning operation; and
  - a post-processing unit configured to output the initial pull-up code and the initial pull-down code as the final pull-up code and the final pull-down code during the initial impedance tuning operation, and configured to generate the final pull-up code and the final pull-down code by using the initial pull-up code and the initial pull-down code during a subsequent impedance tuning operation without external control having been applied to the calibration unit to stop the calibration operation after the initial impedance tuning operation, wherein the post-processing unit comprises:
  - a plurality of pull-up arrays configured to receive a plurality of pull-up codes having the initial pull-up code as a center value, and configured to have a plurality of pull-up impedances respectively corresponding to the plurality of pull-up codes;
  - a plurality of pull-down arrays respectively coupled to the plurality of pull-up arrays, the plurality of pull-down arrays configured to receive a plurality of pull-down codes having the initial pull-down code as a center value, and configured to have a plurality of pull-down impedances respectively corresponding to the plurality of pull-down codes;
  - a plurality of comparators configured to generate a plurality of output signals by comparing voltages at a plurality of nodes between the plurality of pull-up arrays and the plurality of pull-down arrays with a reference voltage; and
  - a decision circuit configured to determine the final pull-up code and the final pull-down code based upon the plurality of output signals of the plurality of comparators.

7. The integrated circuit of claim 6, wherein the integrated circuit includes at least one of a system-on-chip, a mobile system-on-chip, a processor, a memory controller an memory device.

8. The integrated circuit of claim 6, wherein the external resistor is located outside the integrated circuit.

9. An integrated circuit comprising:
- a calibration unit;
- a post-processing unit responsive to an initial pull-up code and an initial pull-down code from the calibration unit and configured to output final pull-up codes and final pull-down codes; and
- an output driver having: a pull-up array that, in response to a final pull-up code, has a pull-up impedance corresponding to the final pull-up code, and a pull-down array that, in response to a final pull-down code, has a pull-down impedance corresponding to the final pull-down code, wherein the post-processing unit comprises:
- a plurality of pull-up arrays configured to receive a plurality of pull-up codes having the initial pull-up code as a center value, and configured to have a plurality of pull-up impedances respectively corresponding to the plurality of pull-up codes;
- a plurality of pull-down arrays respectively coupled to the plurality of pull-up arrays, the plurality of pull-down arrays configured to receive a plurality of pull-down codes having the initial pull-down code as a center value, and configured to have a plurality of pull-down impedances respectively corresponding to the plurality of pull-down codes;

a plurality of comparators configured to generate a plurality of output signals by comparing voltages at a plurality of nodes between the plurality of pull-up arrays and the plurality of pull-down arrays with a reference voltage; and a decision circuit configured to determine the final pull-up code and the final pull-down code based upon the plurality of output signals of the plurality of comparators.

10. The integrated circuit of claim 9, wherein during an initial impedance tuning operation, the calibration unit is configured to generate the initial pull-up code by adjusting a pull-up impedance of an internal pull-up array based upon external resistor, and to generate the initial pull-down code by adjusting a pull-down impedance of an internal pull-down array using the adjusted pull-up impedance, and wherein during the initial impedance timing operation, the post-processing unit is configured to output the initial pull-up code and the initial pull-down code as a final pull-up code and a final pull-down code.

11. The integrated circuit of claim 10, wherein during the subsequent impedance tuning operation, the post-processing unit is configured to select as the final pull-up code, one pull-up code from a plurality of pull-up codes having the initial pull-up code as a center value, and is configured to select as the final pull-down code, one pull-down code from a plurality of pull-down codes having the initial pull-down code as the center value.

* * * * *